US012777865B2

(12) United States Patent
Yeh et al.

(10) Patent No.: US 12,777,865 B2
(45) Date of Patent: Oct. 27, 2026

(54) SUBSTRATE AND METHOD FOR MANUFACTURING A SUBSTRATE

(71) Applicant: Advanced Semiconductor Engineering, Inc., Kaohsiung (TW)

(72) Inventors: Yu-Hung Yeh, Kaohsiung (TW); Bing-Xiu Lu, Kaohsiung (TW); Yu Lin Lu, Kaohsiung (TW); Tai-Yuan Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 748 days.

(21) Appl. No.: 18/078,049

(22) Filed: Dec. 8, 2022

(65) Prior Publication Data

US 2024/0194493 A1 Jun. 13, 2024

(51) Int. Cl.

| | |
|---|---|
| ***H10P 52/00*** | (2026.01) |
| ***H10P 54/00*** | (2026.01) |
| ***H10P 74/20*** | (2026.01) |
| ***H10P 95/00*** | (2026.01) |
| ***H10P 95/60*** | (2026.01) |
| ***H10W 46/00*** | (2026.01) |
| ***H10W 70/695*** | (2026.01) |

(52) U.S. Cl.

CPC .............. *H10P 52/00* (2026.01); *H10P 54/00* (2026.01); *H10P 74/203* (2026.01); *H10P 95/00* (2026.01); *H10P 95/60* (2026.01); *H10W 46/00* (2026.01); *H10W 70/695* (2026.01)

(58) Field of Classification Search

CPC ............... H01L 21/4857; H01L 21/486; H01L 21/76877; H05K 3/0047

See application file for complete search history.

(56) References Cited

U.S. PATENT DOCUMENTS

| | | | | |
|---|---|---|---|---|
| 2015/0047892 | A1* | 2/2015 | Yang | H05K 3/0047 174/262 |
| 2015/0245494 | A1* | 8/2015 | Araki | H05K 3/0047 408/1 R |
| 2019/0074247 | A1* | 3/2019 | Wang | H01L 23/49838 |
| 2020/0335446 | A1* | 10/2020 | Standing | H05K 1/188 |
| 2021/0315103 | A1* | 10/2021 | Tourne | H05K 3/0047 |
| 2024/0114625 | A1* | 4/2024 | Lin | H05K 3/429 |

FOREIGN PATENT DOCUMENTS

| | | | |
|---|---|---|---|
| CN | 112492759 | B * | 5/2021 |
| TW | 200402256 | A | 2/2004 |
| TW | 202138084 | A | 10/2021 |

OTHER PUBLICATIONS

CN112492759A machine translation (Year: 2021).*

* cited by examiner

*Primary Examiner* — Brian Turner

(74) *Attorney, Agent, or Firm* — Foley & Lardner LLP

(57) ABSTRACT

A substrate includes a dielectric structure, a conductive layer, a first hole and a second hole. The conductive layer is stacked on the dielectric structure. The first hole extends from a top surface of the conductive layer and exposes the dielectric structure. The second hole is spaced apart from the first hole, extends from the top surface of the conductive layer and exposes the dielectric structure. A first depth of the first hole is substantially equal to a second depth of the second hole. An elevation of a topmost end of the first hole is different from an elevation of a topmost end of the second hole.

1 Claim, 39 Drawing Sheets

SUBSTRATE AND METHOD FOR MANUFACTURING A SUBSTRATE

BACKGROUND

1. Field of the Disclosure

The present disclosure relates to a substrate and a method for manufacturing a substrate, and to a substrate having a conductive layer and a method for manufacturing a substrate.

2. Description of the Related Art

In the manufacturing processes of substrates, blind holes need to be formed as alignment holes by, for example, machine drilling, laser drilling, sandblasting, or lithography. Machine drilling is the most suitable because of hole types, cost and unit per hour (UPH). Machine drilling generally works through a fixed Z-axis drilling stroke. However, the substrate is often uneven. Thus, the fixed Z-axis drilling stroke applied on the uneven substrate may cause some of the blind holes overdrilled and some of the blind holes underdrilled (i.e., insufficient drilling depth), resulting in a lower manufacturing yield.

SUMMARY

In some embodiments, a method for manufacturing a substrate includes: providing a carrier with a dielectric layer and a conductive layer stacked thereon, wherein the conductive layer has a bottom surface facing the dielectric layer and a top surface; detecting the top surface of the conductive layer; and drilling since the top surface toward the dielectric layer by a predetermined distance no less than a thickness of the conductive layer.

In some embodiments, a method for manufacturing a substrate includes: providing a structure including a first conductive layer and a second conductive layer under the first conductive layer; contacting a top surface of the first conductive layer with a drilling tool to determine a first start point; drilling since the first start point; contacting a top surface of the second conductive layer with the drilling tool to determine a first end point; and stopping drilling after determining the first end point.

In some embodiments, a substrate includes a dielectric structure, a conductive layer, a first hole and a second hole. The conductive layer is stacked on the dielectric structure. The first hole extends from a top surface of the conductive layer and exposes the dielectric structure. The second hole is spaced apart from the first hole, extends from the top surface of the conductive layer and exposes the dielectric structure. A first depth of the first hole is substantially equal to a second depth of the second hole. An elevation of a topmost end of the first hole is different from an elevation of a topmost end of the second hole.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
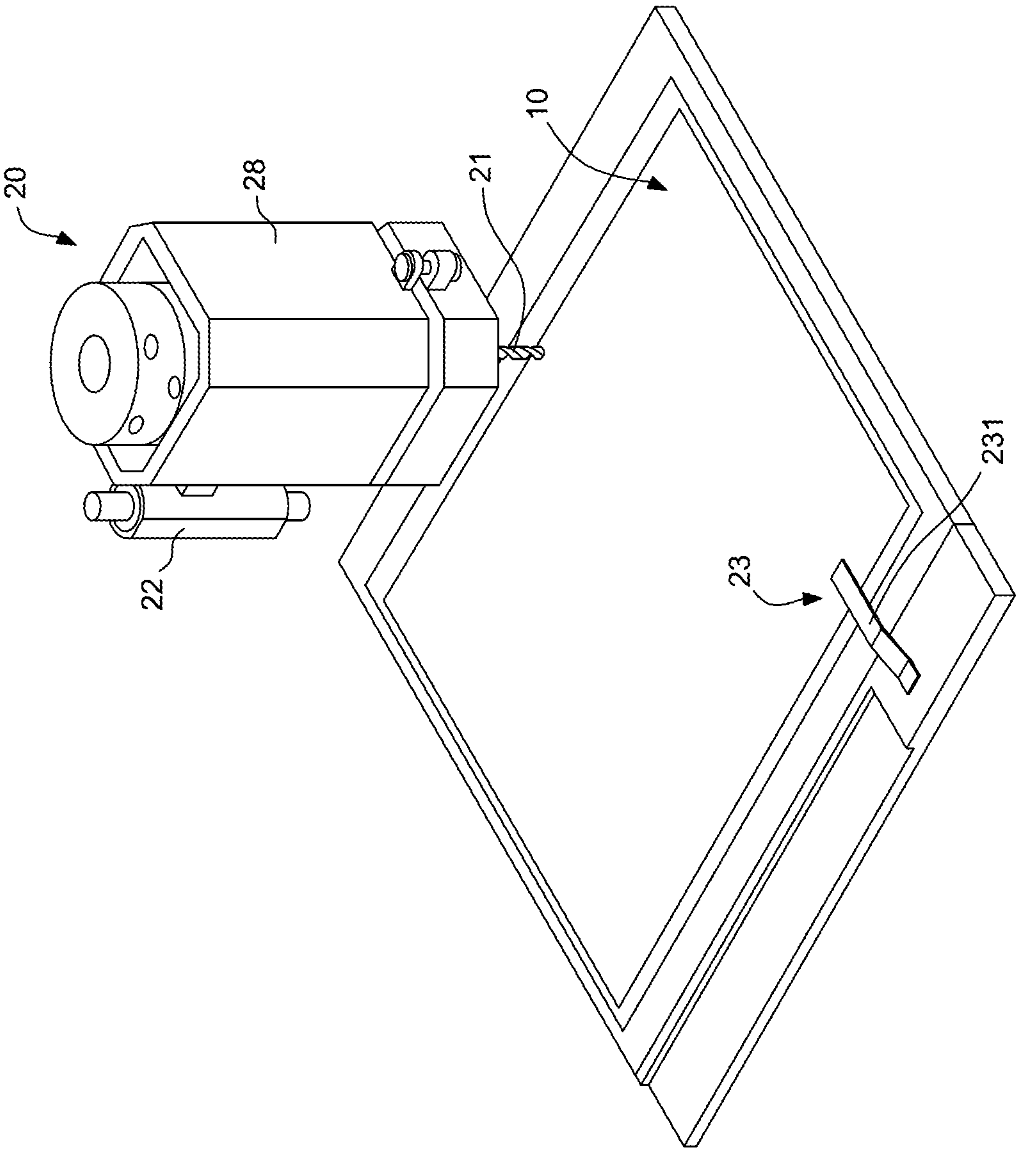
FIG. 1 illustrates a schematic view of one or more stages of an example of a drilling method according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
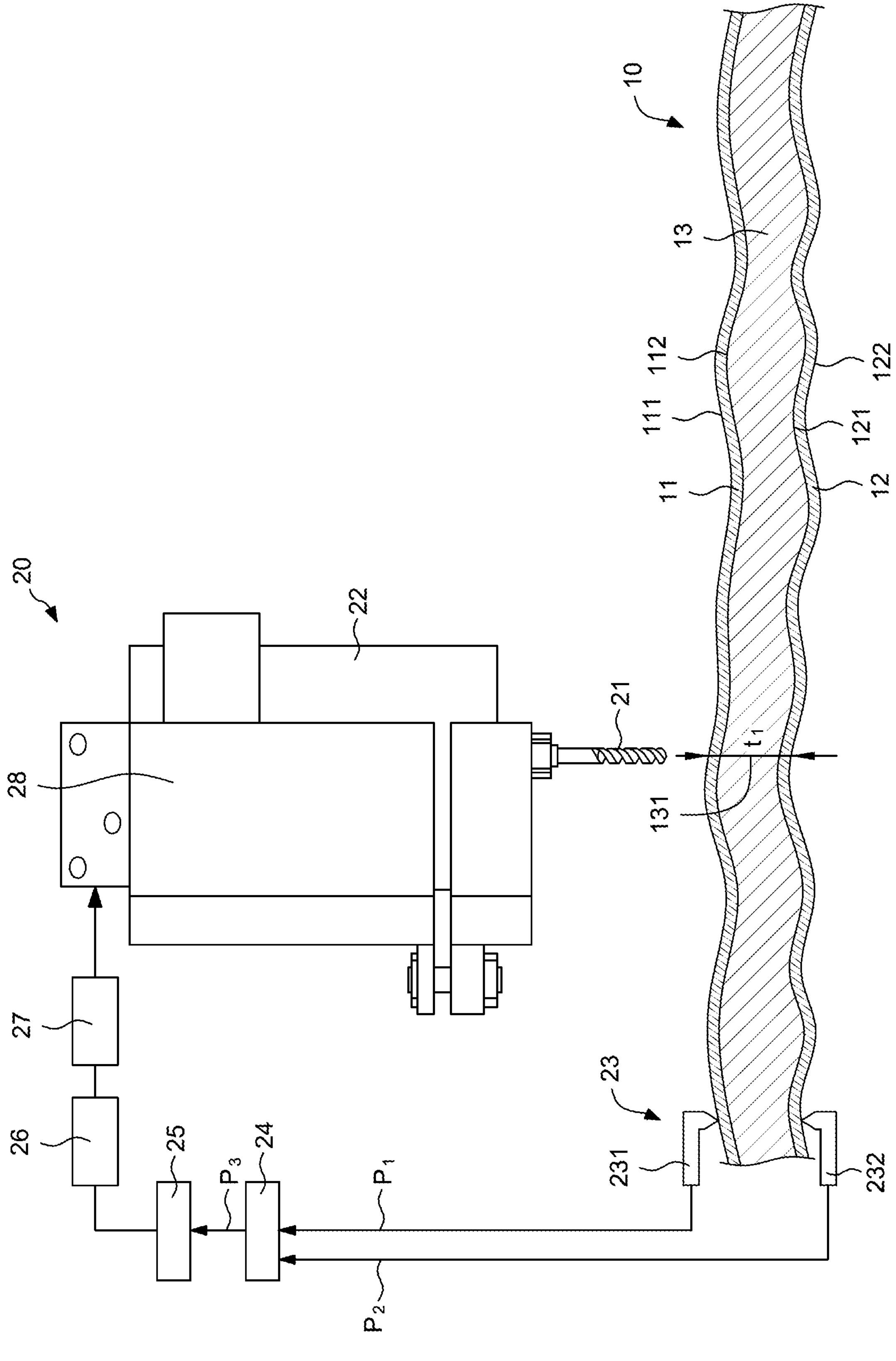
FIG. 2 illustrates a schematic view of one or more stages of an example of a drilling method according to some embodiments of the present disclosure.

FIG. 1 through FIG. 9 illustrate a drilling method according to some embodiments of the present disclosure. Referring to FIG. 1 and FIG. 2, a substrate 10 and a drilling device 20 are provided. FIG. 1 may be a schematic perspective view of the substrate 10 and the drilling device 20 in accordance with some embodiments of the present disclosure. FIG. 2 may be a schematic cross-sectional view of the substrate 10 and a side view the drilling device 20 in accordance with some embodiments of the present disclosure. The drilling device 20 may be configured to drill the substrate 10.

The substrate 10 may be a structure or an assembly structure. The substrate 10 may be, for example, a laminated substrate or an embedded substrate. The substrate 10 may include a first conductive layer 11, a second conductive layer 12 and a dielectric structure 13. The first conductive layer 11 may be, for example, a metal layer or a circuit layer. In some embodiments, the first conductive layer 11 may include conductive polymer such as polyacetylene. The first conductive layer 11 has a first conductive surface 111 and a second conductive surface 112. The first conductive surface 111 of the first conductive layer 11 may be a top surface of the substrate 10. The second conductive surface 112 is opposite to the first conductive surface 111. The second conductive layer 12 may be longitudinally spaced apart from the first conductive layer 11. The second conductive layer 12 may be disposed under the first conductive layer 11. The second conductive layer 12 may be, for example, a metal layer or a circuit layer. In some embodiments, the second conductive layer 12 may include conductive polymer such as polyacetylene. The second conductive layer 12 has a first conductive surface 121 and a second conductive surface 122. The second conductive surface 122 of the second conductive layer 12 may be a bottom surface of the substrate 10. The first conductive surface 121 of the second conductive layer 12 may be longitudinally spaced apart from the first conductive surface 111 of the first conductive layer 11. The second conductive surface 122 is opposite to the first conductive surface 121. The dielectric structure 13 may be disposed between the first conductive layer 11 and the second conductive layer 12. For example, the dielectric structure 13 may be made of a cured photoimageable dielectric (PID) material such as epoxy or polyimide (PI) including photoinitiators. For example, the dielectric structure 13 may include a homogeneous material. For example, the material of the dielectric structure 13 may include epoxy type FR5, FR4, Bismaleimide triazine (BT), print circuit board (PCB) material, Ajinomoto build-up film (ABF) or other suitable materials. In some embodiments, the first conductive layer 11 may be laminated on a top surface of the dielectric structure 13, and the second conductive layer 12 may be laminated on a bottom surface of the dielectric structure 13 to form the substrate 10.

In some embodiments, as shown in FIG. 2, the first conductive surface 111 of the first conductive layer 11 and the first conductive surface 121 of the second conductive layer 12 may be uneven surfaces. The second conductive surface 112 of the first conductive layer 11 and the second conductive surface 122 of the second conductive layer 12 may be uneven surfaces. Alternatively, the first conductive surface 111 of the first conductive layer 11 may be non-parallel with the first conductive surface 121 and the second conductive surface 122 of the second conductive layer 12. The second conductive surface 112 of the first conductive layer 11 may be non-parallel with the first conductive surface 121 and the second conductive surface 122 of the second conductive layer 12. The top surface of the dielectric structure 13 may be non-parallel with the bottom surface of the dielectric structure 13. Thus, the substrate 10 may have a non-uniform thickness or an inconsistent thickness. However, in other embodiments, the substrate 10 may have a uniform thickness or a consistent thickness, but have a wavy structure.

Referring to FIG. 1 and FIG. 2 again, the drilling device 20 may be disposed above the first conductive surface 111 of the first conductive layer 11 of the substrate 10. The drilling device 20 may be, for example, a computer numerical control (CNC) drilling device or a numerical control (NC) drilling device. The drilling device 20 may include a device body 28, a drilling tool 21, a current source 22, a conductive element 23, a signal receiver 24 (e.g., a signal converter), a control unit 25, a record unit 26, and a data processing unit 27. The drilling tool 21 (e.g., a drill bit) may be disposed at a bottom of the device body 28 and configured to drill the substrate 10. The drilling tool 21 (e.g., a drill bit) may be disposed above or corresponding to a first portion 131 of the substrate 10. The first portion 131 of the substrate 10 may have a first thickness $t_1$.

The current source 22 may be electrically connected to the drilling tool 21 and configured to generate or provide an electric signal to stop the drilling process of the drilling tool 21. The conductive element 23 may be configured to contact the substrate 10 (e.g., the first conductive surface 111 of the first conductive layer 11 and the second conductive surface 122 of the second conductive layer 12). The conductive element 23 may be a conductive pressing element, and may include a first conductive element 231 (e.g., a first conductive pressing element) and a second conductive element 232 (e.g., a second conductive pressing element). The first conductive element 231 may physically connect and electrically connect the first conductive surface 111 of the first conductive layer 11 of the substrate 10. The second conductive element 232 may physically connect and electrically connect the second conductive surface 122 of the second conductive layer 12 of the substrate 10. Thus, the current source 22 may be electrically connected to the drilling tool 21 through the conductive element 23 (including the first conductive element 231 and the second conductive element 232) and the substrate 10 (e.g., the first conductive surface 111 of the first conductive layer 11 and the first conductive surface 121 of the second conductive layer 12).

The signal receiver 24 may be electrically connected to the conductive element 23 (including the first conductive element 231 and the second conductive element 232). For example, the signal receiver 24 may be electrically connected to the first conductive element 231 and the second conductive element 232 through a first electrical path $P_1$ and a second electrical path $P_2$, respectively. However, in other embodiments, the first electrical path $P_1$ and the second electrical path $P_2$ may be a same electrical path. The signal receiver 24 may be configured to convert a waveform of the electric signal (transmitted form the first electrical path $P_1$ and the second electrical path $P_2$) from a triangle wave or a sine wave to a square wave. That is, the signal receiver 24 may be configured to process the electric signal and filter noise so as to obtain a distinguishable signal.

The control unit 25 may be a computer numerical control (CNC) unit or a numerical control (NC) unit. The control unit 25 may be electrically connected to the signal receiver 24 through a third electrical path $P_3$. The control unit 25 may be configured to control the actions of the drilling tool 21 according to the electric signal from the third electrical path $P_3$. The record unit 26 may be electrically connected to the control unit 25 and the current source 22, and configured to record the elevations of position points (e.g., the start point $S_p$ and the end point $E_p$ as stated below) of drilling. The elevation of a specific point may be a vertical distance between the specific point and a horizontal reference plane. The data processing unit 27 may be electrically connected to the record unit 26 and configured to determine a flatness of the substrate 10 according to the elevations of position points of drilling recorded in the record unit 26.

Figure 3:
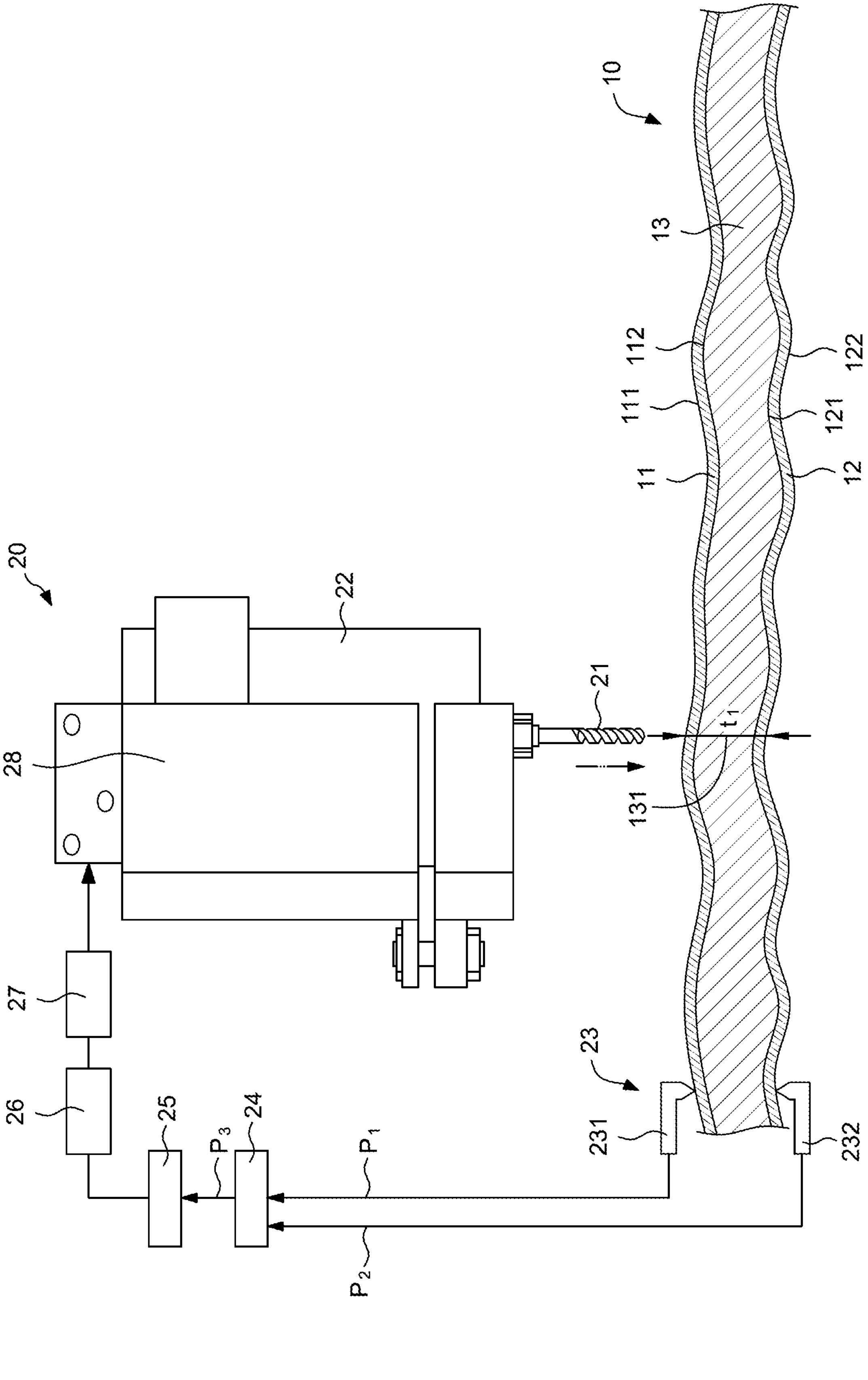
FIG. 3 illustrates a schematic view of one or more stages of an example of a drilling method according to some embodiments of the present disclosure.

Referring to FIG. 3, the drilling tool 21 is moved toward the substrate 10.

Figure 4:
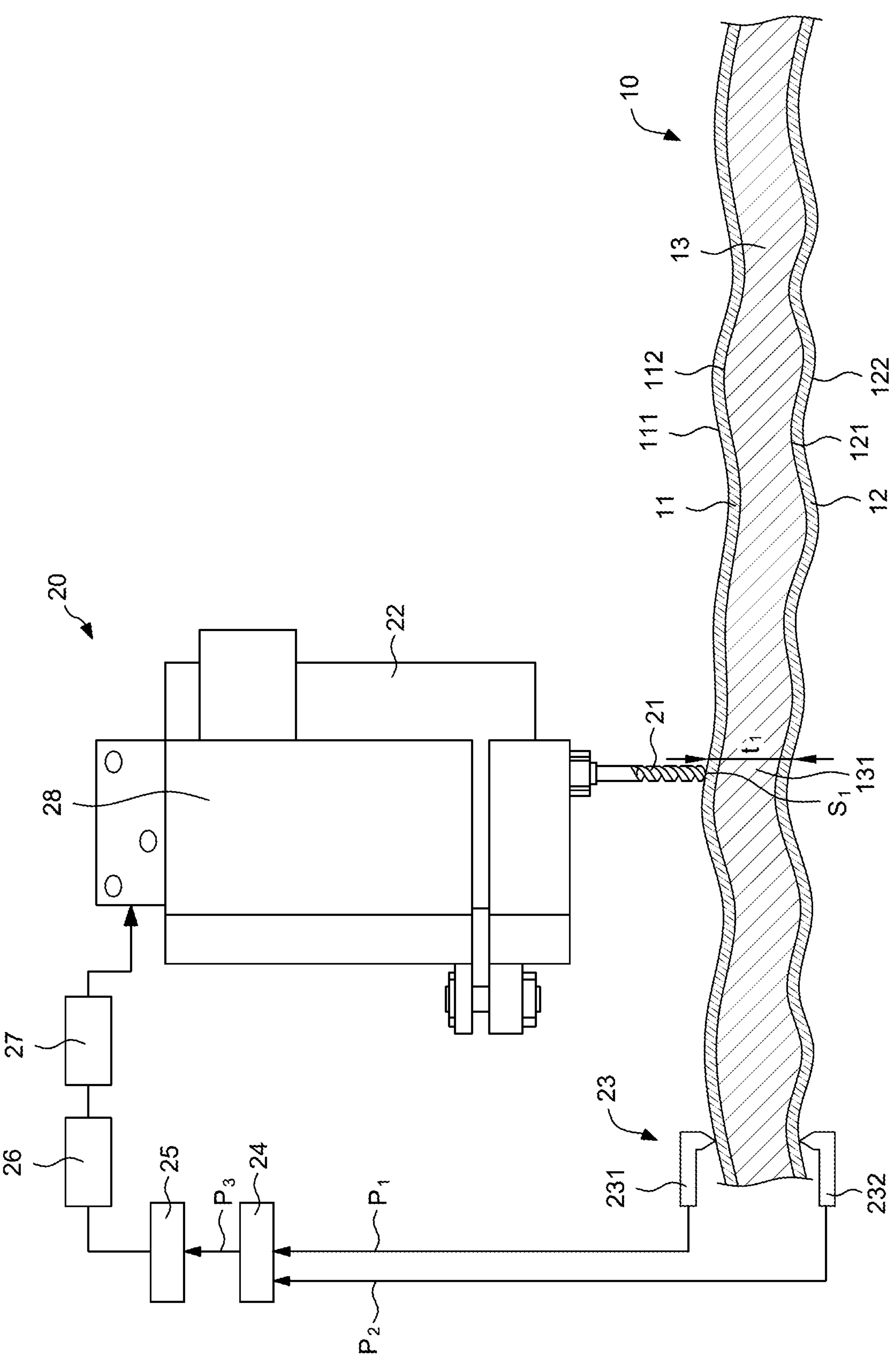
FIG. 4 illustrates a schematic view of one or more stages of an example of a drilling method according to some embodiments of the present disclosure.

Referring to FIG. 4, the drilling tool 21 is moved to contact the substrate 10. In some embodiments, the top surface 111 of the first conductive layer 11 may be contacted with the drilling tool 21 so as to determine a first start point $S_1$. The first start point $S_1$ is defined through a first electric signal (or a first signal) generated by the drilling tool 21 contacting the first conductive surface 111 of the first conductive layer 11. In some embodiments, the record unit 26 and the data processing unit 27 may receive the first signal when the drilling tool 27 contacts the first conductive layer 11 to determine the first start point $S_1$. Meanwhile, a first electrical loop is formed through electrical connections of the drilling tool 21, the first conductive surface 111 of the first conductive layer 11, the first conductive element 231 and the current source 22. That is, the first electrical loop is formed when the drilling tool 21 contacts the first conductive layer 11. In some embodiments, the first electrical loop may generate the first electric signal. In some embodiments, when the first electrical loop and the first electric signal are generated, the drilling tool 21 starts to rotate so as to start the drilling process or drilling operation. In some embodiments, the flatness of the substrate 10 may be estimated by a variation of a plurality of first start points $S_1$ at different locations of the substrate 10. For example, the flatness of the substrate 10 may be determined by comparing the elevations of the first start points $S_1$ at different locations of the substrate 10.

Figure 5:
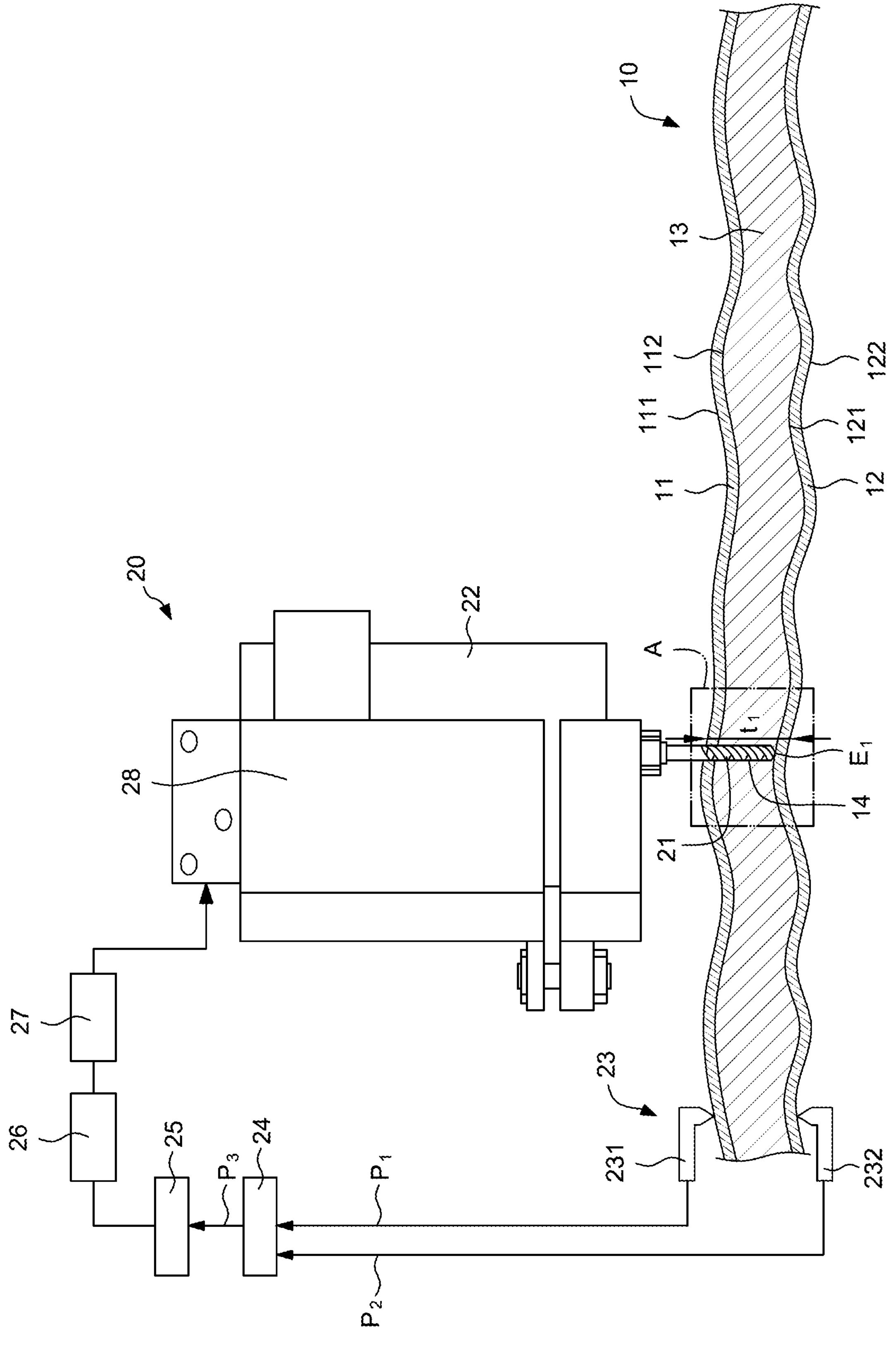
FIG. 5 illustrates a schematic view of one or more stages of an example of a drilling method according to some embodiments of the present disclosure.
Figure 6:
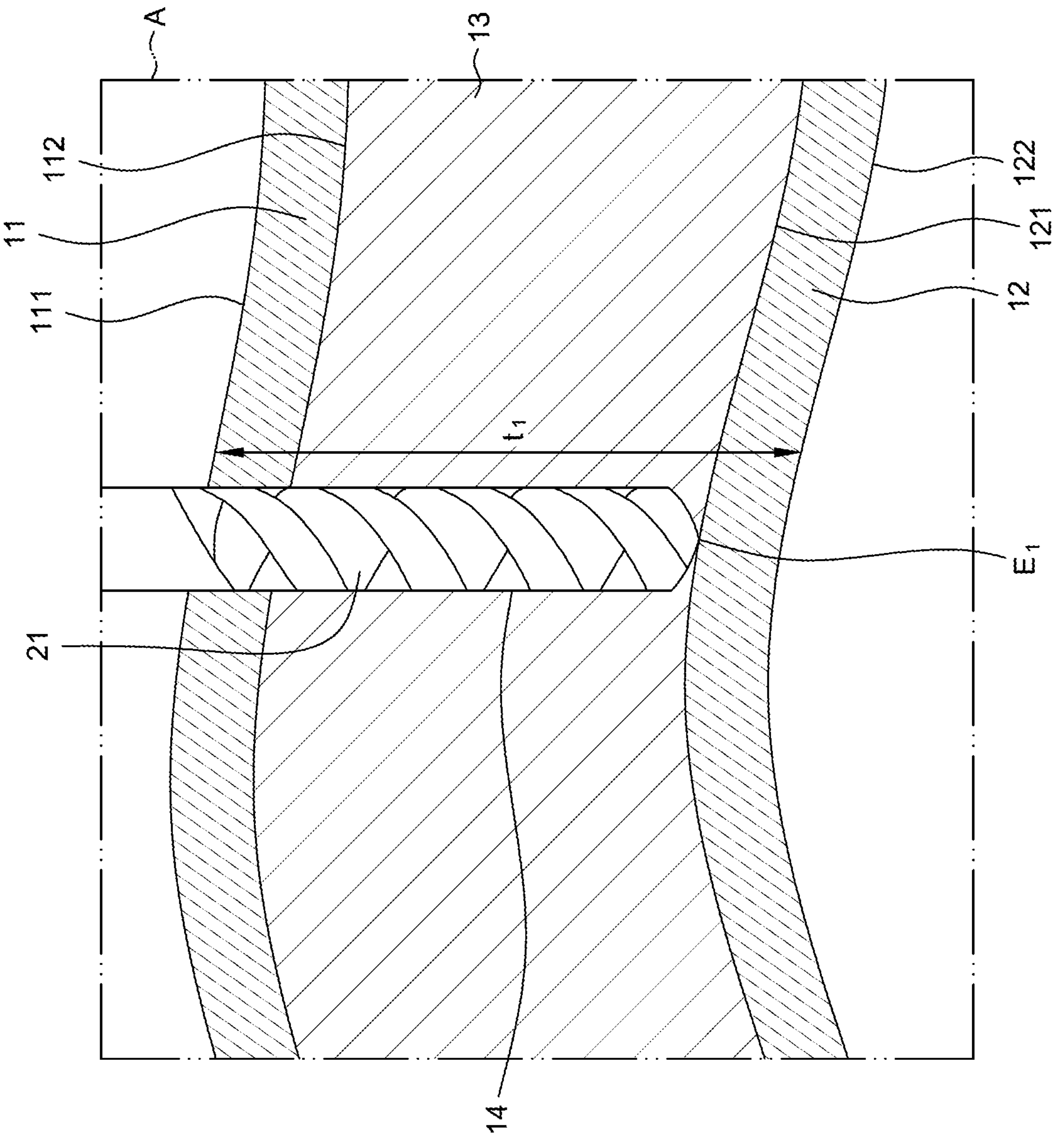
FIG. 6 illustrates an enlarged view of a region "A" in FIG. 5.

Referring to FIG. 5 and FIG. 6, wherein FIG. 6 illustrates an enlarged view of a region "A" in FIG. 5, the drilling tool 21 is moved downward to penetrate through the first conductive layer 11 and the dielectric structure 13, and contact the first conductive surface 121 of the second conductive layer 12. The first conductive layer 11 may be drilled since the first start point $S_1$. The first portion 131 (e.g., a portion of the first conductive layer 11 and a portion of the dielectric structure 13) of the substrate 10 of FIG. 4 may be removed through the drilling tool 21. A first end point $E_1$ is defined through a second electric signal (or a second signal) generated by the drilling tool 21 contacting the first conductive surface 121 of the second conductive layer 12. That is, the top surface 121 of the second conductive layer 12 may be contacted with the drilling tool 21 so as to determine the first end point $E_1$. In some embodiments, the record unit 26 and the data processing unit 27 may receive the second signal when the drilling tool 27 contacts the second conductive layer 12 to determine the first end point $E_1$. The first end point $E_1$ is located on the first conductive surface 121 of the second conductive layer 12. Meanwhile, a second electrical loop is formed through electrical connections of the drilling tool 21, the second conductive surface 122 of the second conductive layer 12, the second conductive element 232 and the current source 22. That is, the second electrical loop is formed when the drilling tool 21 contacts the second conductive layer 12. In some embodiments, the second electrical loop may generate the second electric signal. In some embodiments, the second electric signal is generated after the first electric signal disappears. Thus, there is a time difference between the second electric signal and the first electric signal. In some embodiments, the second electric signal may be generated when the first electric signal does not disappear. In some embodiments, when the second electrical loop and the second electric signal are generated, the drilling tool 21 may stop to rotate and may be removed from the substrate 10 so as to stop the drilling process or drilling operation. Thus, the drilling process or the drilling operation of the drilling tool 21 may stop at the first end point $E_1$ of second conductive layer 12. That is, the drilling process or drilling operation may be stopped after determining the first end point $E_1$.

In some embodiments, the flatness or the thickness uniformity of the substrate 10 may be estimated by a variation of a plurality of first end points $E_1$ at different locations of the substrate 10. For example, the first thickness $t_1$ of the first portion 131 of the substrate 10 may be substantially determined by a difference between the elevation of the first start point $S_1$ and the elevation of the first end point $E_1$. Thus, the thickness uniformity of the substrate 10 may be determined by comparing the first thickness $t_1$ at different locations of the substrate 10.

Figure 7:
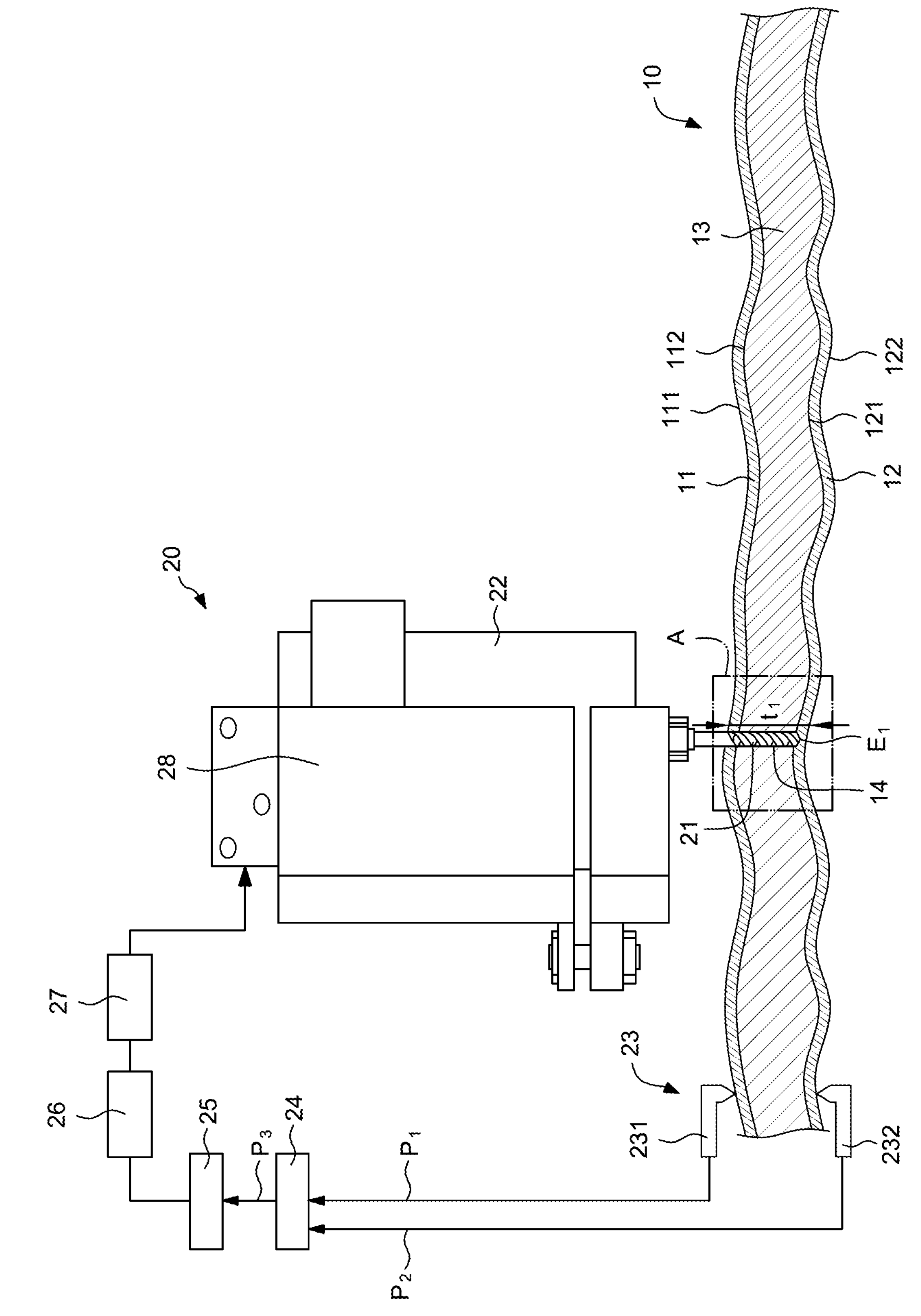
FIG. 7 illustrates a schematic view of one or more stages of an example of a drilling method according to some embodiments of the present disclosure.
Figure 8:
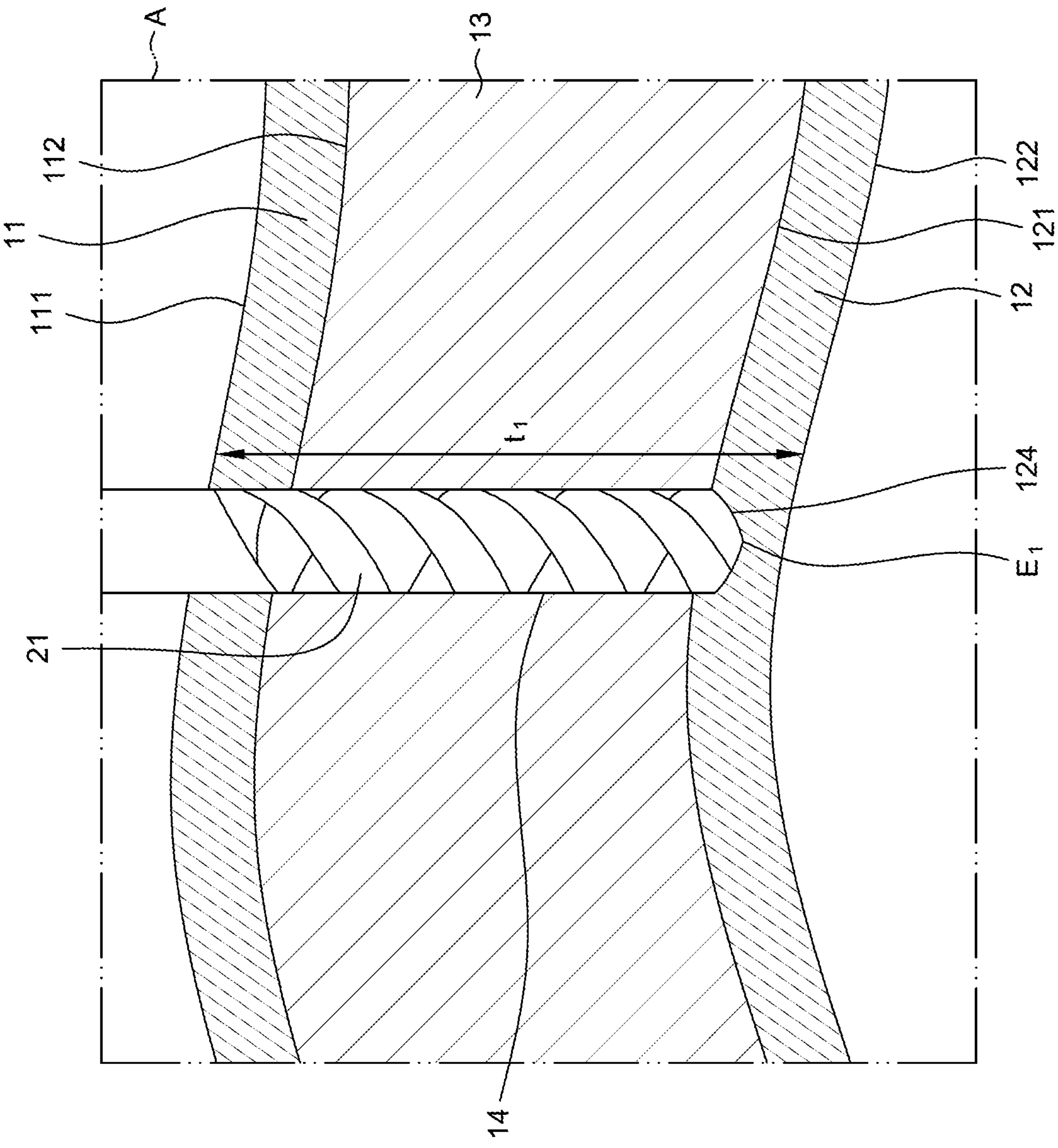
FIG. 8 illustrates an enlarged view of a region "A" in FIG. 7.

Referring to FIG. 7 and FIG. 8, wherein FIG. 8 illustrates an enlarged view of a region "A" in FIG. 7, the drilling tool 21 may be further moved downward to remove a portion of the second conductive layer 12, including the first conductive surface 121 of the second conductive layer 12. Thus, a first dimple 124 may be formed on the first conductive surface 121 of the second conductive layer 12. The first dimple 124 may be recessed from the first conductive surface 121 of the second conductive layer 12. The first end point $E_1$ may be a bottom end of the first dimple 124. In some embodiments, a first drilling depth (or stroke) of the drilling tool 21 may be determined according to a distance between the first start point $S_1$ and the first end point $E_1$. For example, the first drilling depth may be substantially equal to a value that subtracts a thickness of the second conductive layer 12 corresponding to the first portion 131 of the substrate 10 from the first thickness $t_1$ of the first portion 131 of the substrate 10. In some embodiments, the thickness uniformity of the substrate 10 may also be estimated by a variation of a plurality of first drilling depths of the drilling tool 21 at different locations for forming different holes of the substrate 10.

Figure 9:
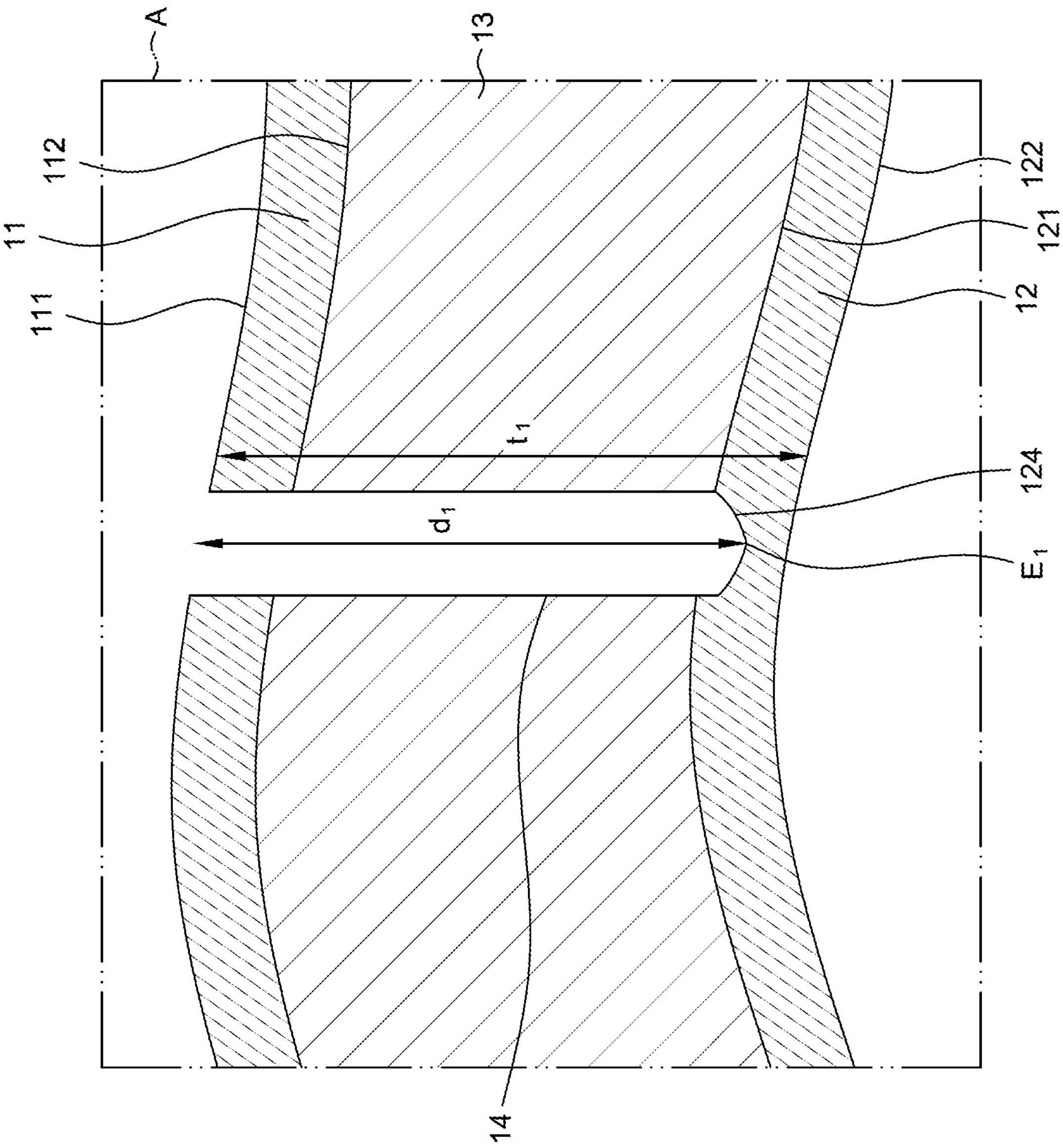
FIG. 9 illustrates a schematic view of one or more stages of an example of a drilling method according to some embodiments of the present disclosure.

Referring to FIG. 9, the drilling device 20 is moved upward so that the drilling tool 21 is removed from the substrate 10 so as to form a first hole 14 in the substrate 10. The first hole 14 may stop at the second conductive layer 12. That is, a portion of the second conductive layer 12 may be exposed in the first hole 14. The first hole 14 may include the first dimple 124. The first hole 14 may be a blind hole that does not extend through the second conductive layer 12. The first hole 14 may have a first depth $d_1$. The first depth $d_1$ of the first hole 14 may be substantially equal to the first drilling depth (or stroke) of the drilling tool 21.

As shown in the embodiment illustrated in FIG. 1 through FIG. 9, the first drilling depth (or stroke) of the drilling tool 21 can be precisely and immediately determined through the first start point $S_1$ defined by the first electric signal and the first end point $E_1$ defined by the second electric signal. Such design may prevent the drilling tool 21 from overdrilling or underdrilling, leading to an improved manufacturing yield. Thus, even if the substrate 10 has a non-uniform thickness or an inconsistent thickness, the first hole 14 may be formed precisely to extend through the first conductive layer 11 and the dielectric structure 13 completely and to expose a portion of the second conductive layer 12. Alternatively, although the first conductive surface 111 of the first conductive layer 11 of the substrate 10 is uneven or non-flat, the first hole 14 may still be formed precisely to terminate at the second conductive layer 12 and expose a portion of the second conductive layer 12.

Figure 10:
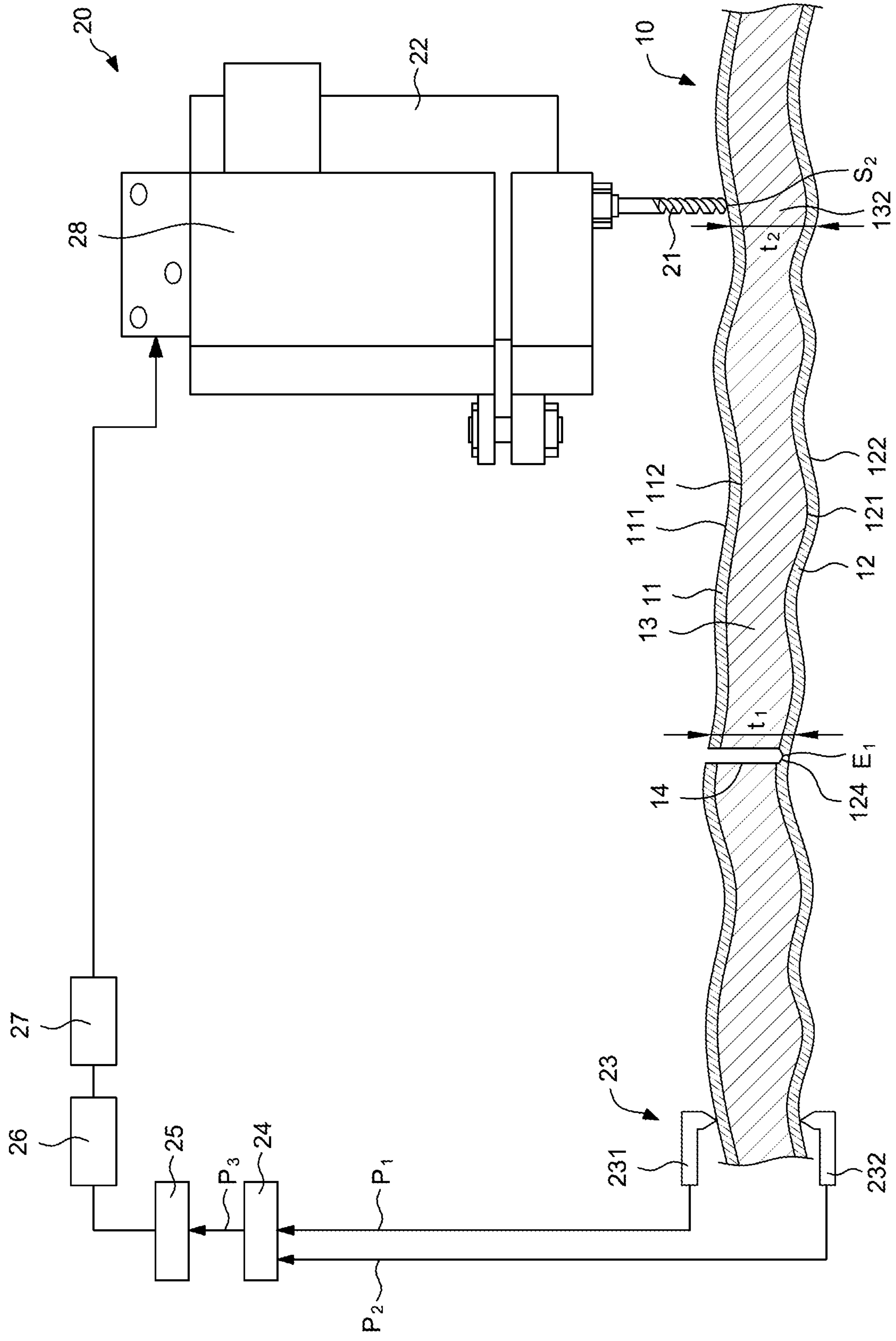
FIG. 10 illustrates a schematic view of one or more stages of an example of a drilling method according to some embodiments of the present disclosure.

FIG. 10 through FIG. 13 illustrate a drilling method according to some embodiments of the present disclosure. The initial stages of the illustrated process are the same as, or similar to, the stages illustrated in FIG. 1 and FIG. 9. FIG. 10 depicts a stage subsequent to that depicted in FIG. 9.

Referring to FIG. 10, the drilling device 20 and the drilling tool 21 are moved to a position above or corresponding to a second portion 132 of the substrate 10. The second portion 132 of the substrate 10 may have a second thickness $t_2$. The second thickness $t_2$ of the second portion 132 of the substrate 10 may be different from the first thickness $t_1$ (FIG. 4) of the first portion 131 of the substrate 10. For example, a thickness of a second portion of the dielectric structure 13 of the second portion 132 of the substrate 10 may be different from a thickness of a first portion of the dielectric structure 13 of the first portion 131 of the substrate 10. Then, the drilling tool 21 is moved downward to contact the substrate 10. In some embodiments, the top surface 111 of the first conductive layer 11 may be contacted with the drilling tool 21 so as to determine a second start point $S_2$. The second start point $S_2$ is defined through a third electric signal generated by the drilling tool 21 contacting the first conductive surface 111 of the first conductive layer 11. The elevation of the second start point $S_2$ may be same as or different form the elevation of the first start point $S_1$. Meanwhile, a third electrical loop is formed through electrical connections of the drilling tool 21, the first conductive surface 111 of the first conductive layer 11, the first conductive element 231 and the current source 22. In some embodiments, the third electrical loop may generate the third electric signal. In some embodiments, the third electrical loop and the third electric signal may be same as or similar to the first electrical loop and the first electric signal, respectively. In some embodiments, when the third electrical loop and the third electric signal are generated, the drilling tool 21 starts to rotate so as to start the drilling process or drilling operation. In some embodiments, the flatness of the substrate 10 may be estimated by a variation of a plurality of second start point $S_2$ at different locations of the substrate 10. For example, the flatness of the substrate 10 may be determined by comparing an elevation of the first start point $S_1$ and an elevation of the second start point $S_2$.

The flatness of the structure 10 (substrate 10) may be estimated from the variation between the elevation of the first start point $S_1$ and the elevation of the second start point $S_2$.

Figure 11:
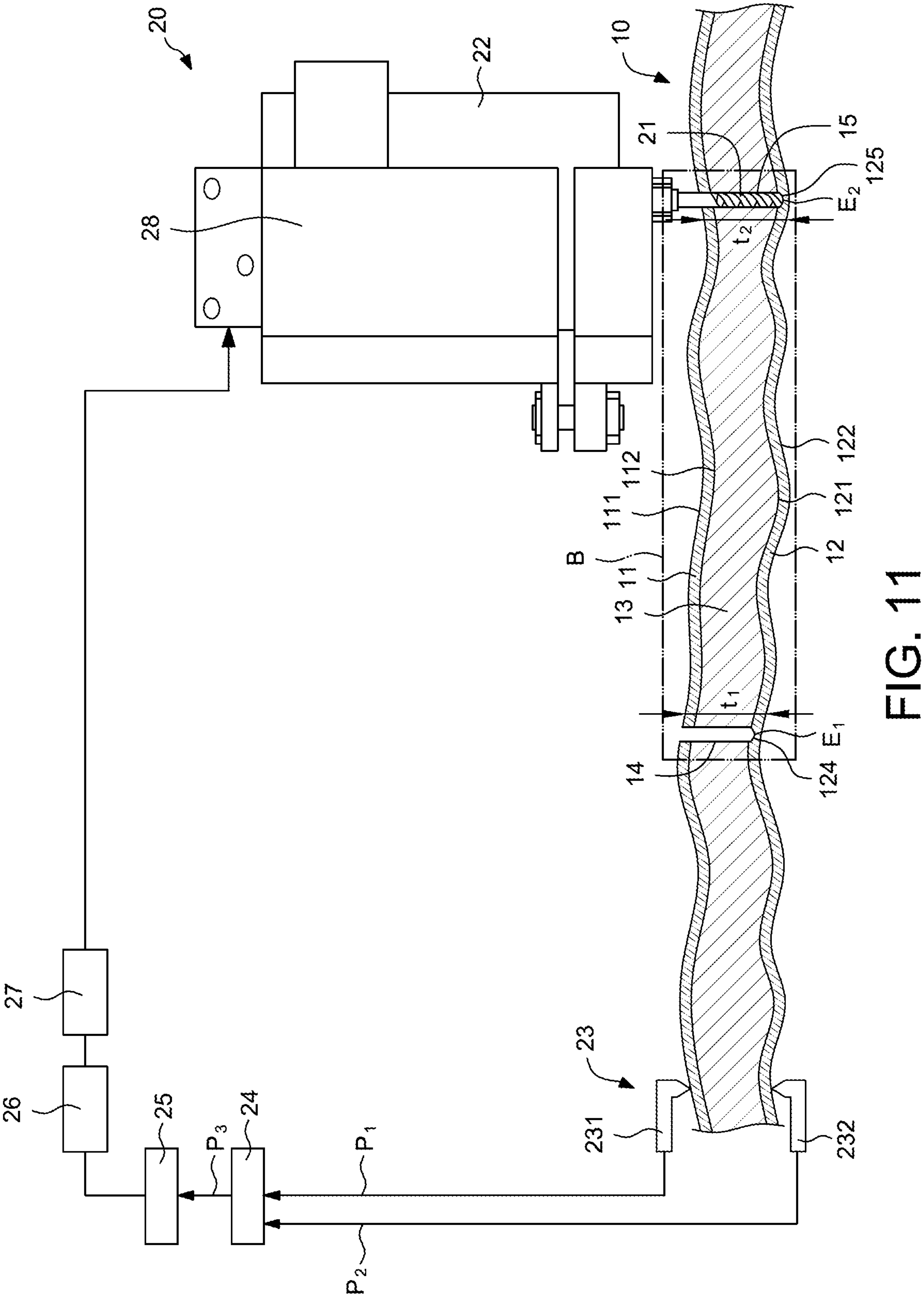
FIG. 11 illustrates a schematic view of one or more stages of an example of a drilling method according to some embodiments of the present disclosure.
Figure 12:
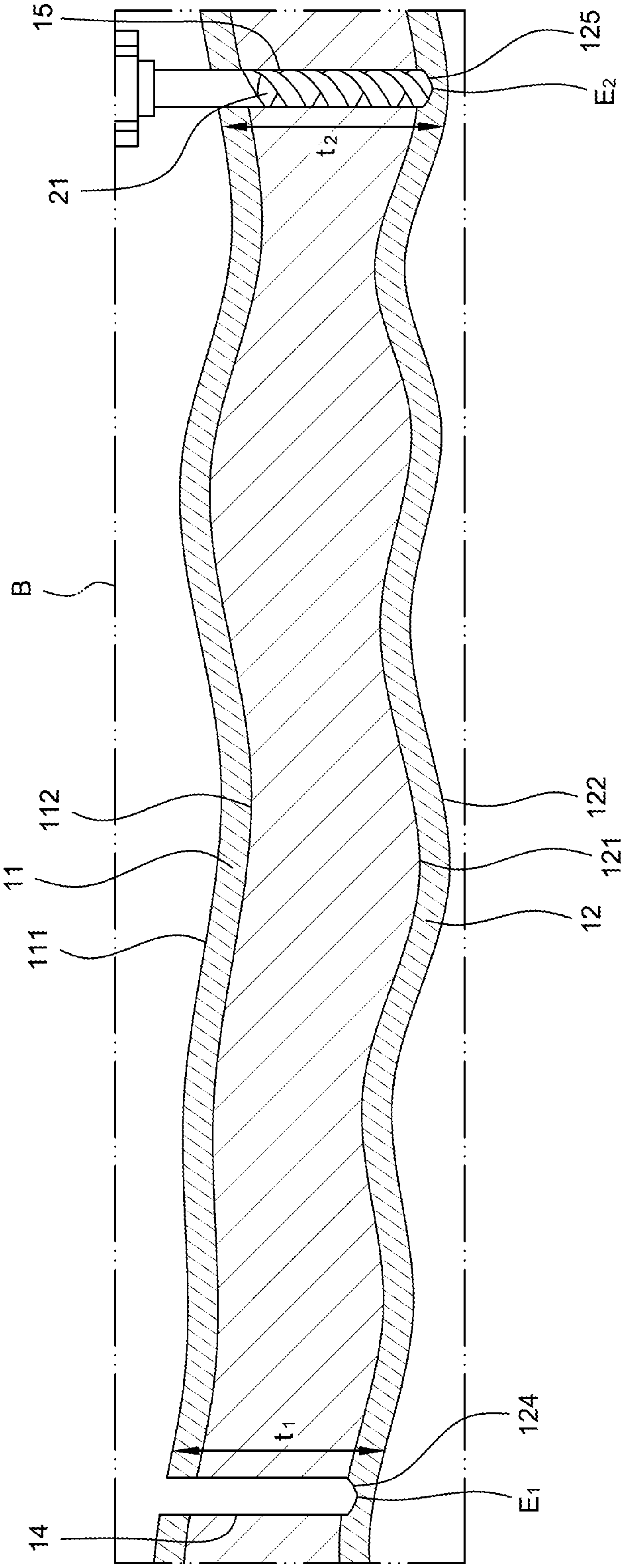
FIG. 12 illustrates an enlarged view of a region "B" in FIG. 11.

Referring to FIG. 11 and FIG. 12, wherein FIG. 12 illustrates an enlarged view of a region "B" in FIG. 11, the drilling tool 21 is moved downward to penetrate through the first conductive layer 11 and the dielectric structure 13. The first conductive layer 11 may be drilled since the second start point $S_2$. A second end point $E_2$ is defined through a fourth electric signal generated by the drilling tool 21 contacting the first conductive surface 121 of the second conductive layer 12. That is, the top surface 121 of the second conductive layer 12 may be contacted with the drilling tool 21 so as to determine the second end point $E_2$. The second end point $E_2$ is located on the first conductive surface 121 of the second conductive layer 12. The elevation of the second end point $E_2$ may be same as or different form the elevation of the first end point $E_1$. Meanwhile, a fourth electrical loop is formed through electrical connections of the drilling tool 21, the first conductive surface 121 of the second conductive layer 12, the second conductive element 232 and the current source 22. In some embodiments, the fourth electrical loop may generate the fourth electric signal. In some embodiments, the fourth electrical loop and the fourth electric signal may be same as or similar to the second electrical loop and the second electric signal, respectively. In addition, the fourth electric signal is generated after the third electric signal disappears. Thus, there is a time difference between the fourth electric signal and the third electric signal. In some embodiments, the fourth electric signal may be generated when the third electric signal does not disappear. In some embodiments, when the fourth electrical loop and the fourth electric signal are generated, the drilling tool 21 may stop to rotate so as to stop the drilling process or drilling operation. Thus, the drilling process or the drilling operation of the drilling tool 21 may stop at the second end point $E_2$ of second conductive layer 12. That is, the drilling process or drilling operation may be stopped after determining the second end point $E_2$.

In some embodiments, the flatness or the thickness uniformity of the substrate 10 may be estimated by a variation of a plurality of second end points $E_2$ at different locations of the substrate 10. For example, the second thickness $t_2$ of the second portion 132 of the substrate 10 may be substantially determined by a difference between the elevation of the second start point $S_2$ and the elevation of the second end point $E_2$. Thus, the thickness uniformity of the substrate 10 may be determined by comparing the first thickness $t_1$ and the second thickness $t_2$.

The second portion 132 (e.g., a portion of the first conductive layer 11 and a portion of the dielectric structure 13) of the substrate 10 of FIG. 10 may be removed through the drilling tool 21. In some embodiments, a portion of the second conductive layer 12 may be removed so as to form a second dimple 125 on the first conductive surface 121 of the second conductive layer 12. The second dimple 125 may be recessed from the first conductive surface 121 of the second conductive layer 12. An elevation of the second dimple 125 may be same as or different from an elevation of the first dimple 124. In some embodiments, a second drilling depth (or stroke) of the drilling tool 21 may be determined according to a distance between the second start point $S_2$ and the second end point $E_2$. For example, the second drilling depth may be substantially equal to a value that subtracts a thickness of the second conductive layer 12 corresponding to the second portion 132 of the substrate 10 from the second thickness $t_2$ of the second portion 132 of the substrate 10. In some embodiments, the thickness uniformity of the substrate 10 may also be estimated by a variation of a plurality of second drilling depths of the drilling tool 21 at different locations for forming different holes of the substrate 10. In some embodiments, the second drilling depth may be equal to or different from the first drilling depth.

Figure 13:
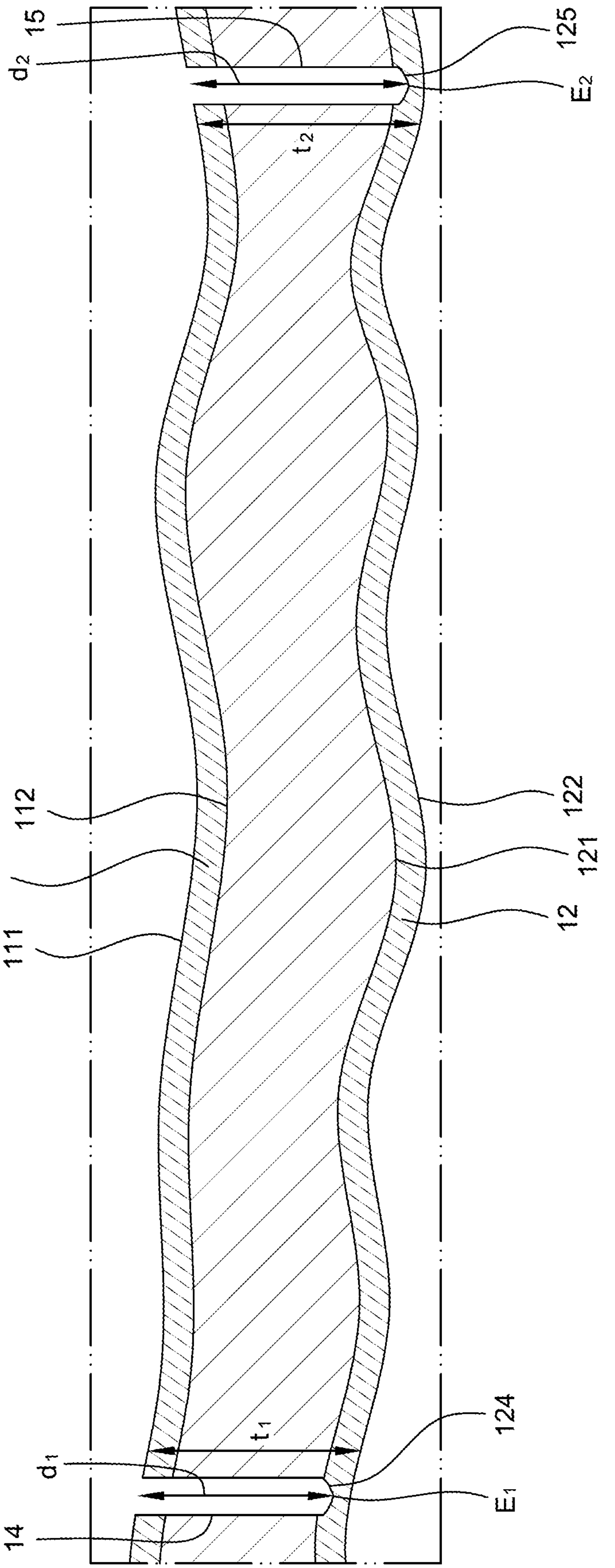
FIG. 13 illustrates a schematic view of one or more stages of an example of a drilling method according to some embodiments of the present disclosure.

Referring to FIG. 13, the drilling device 20 is moved upward so that the drilling tool 21 is removed from the substrate 10 so as to form a second hole 15 in the substrate 10. The second hole 15 may stop at the second conductive layer 12. That is, a portion of the second conductive layer 12 may be exposed in the second hole 15. The second hole 15 may include the second dimple 125. The second hole 15 may be a blind hole that does not extend through the second conductive layer 12. The second hole 15 may have a second depth $d_2$. The second depth $d_2$ of the second hole 15 may be substantially equal to the second drilling depth (or stroke) of the drilling tool 21. In some embodiments, the second depth $d_2$ of the second hole 15 may be equal to or different from the first depth $d_1$ of the first hole 14. A top end of the second hole 15 may be not level with a top end of the first hole 14. A bottom end of the second hole 15 may be not level with a bottom end of the first hole 14.

As shown in the embodiment illustrated in FIG. 10 through FIG. 13, the second drilling depth (or stroke) of the drilling tool 21 can be precisely and immediately determined through the second start point $S_2$ defined by the third electric signal. The second end point $E_2$ defined by the fourth electric signal may prevent the drilling tool 21 from overdrilling or underdrilling, leading to an increased manufacturing yield. Thus, even if the substrate 10 has a non-uniform thickness or an inconsistent thickness, the second hole 15 may be formed precisely to extend through the first conductive layer 11 and the dielectric structure 13 completely and to expose a portion of the second conductive layer 12. Alternatively, although the depth of the second hole 15 may be different from the depth of the first hole 14, both the first hole 14 and the second hole 15 may still be formed precisely to terminate at the second conductive layer 12 and expose a portion of the second conductive layer 12.

Figure 14:
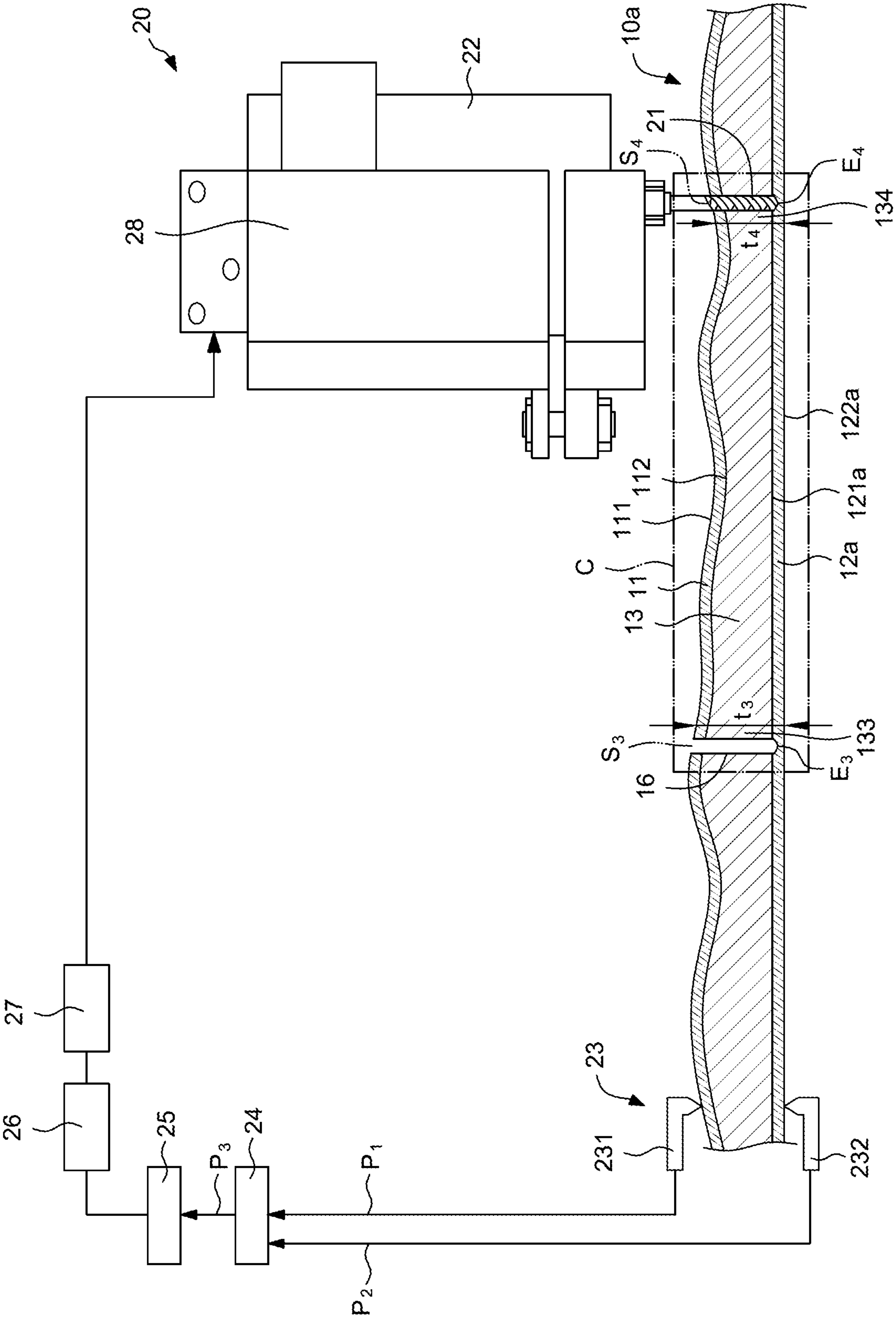
FIG. 14 illustrates a schematic view of one or more stages of an example of a drilling method according to some embodiments of the present disclosure.
Figure 15:
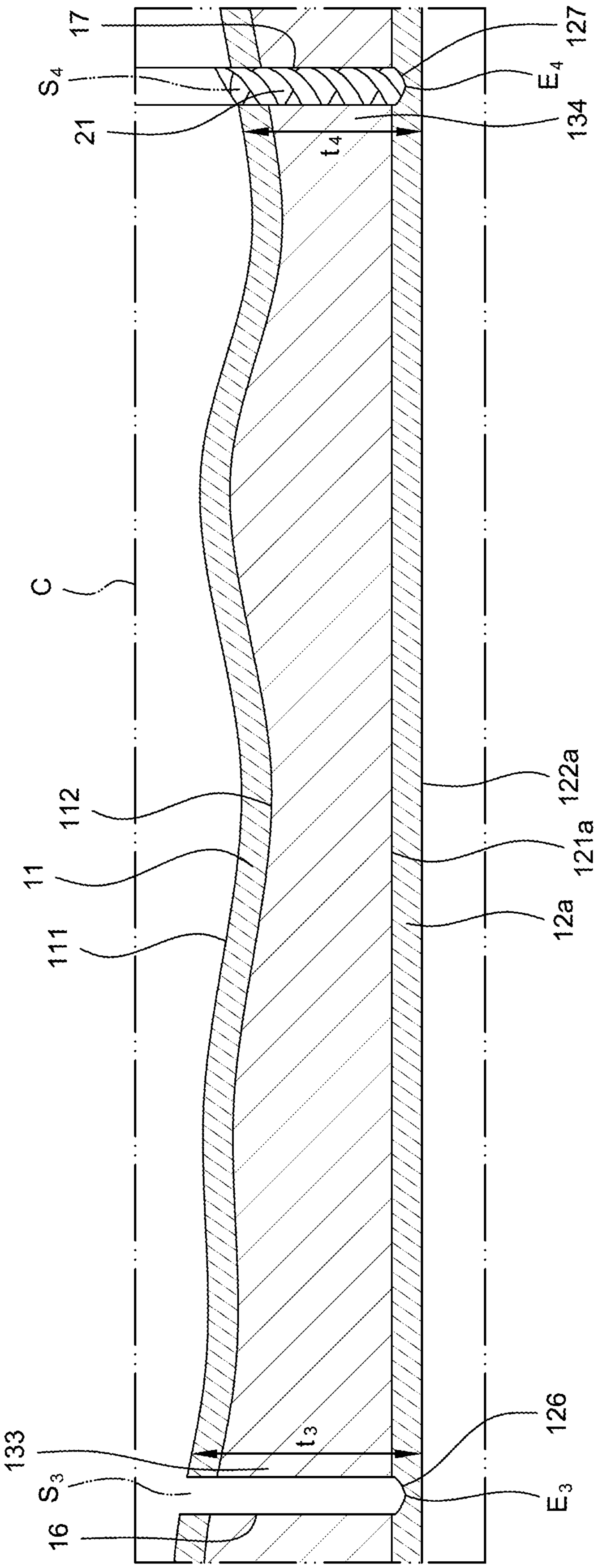
FIG. 15 illustrates an enlarged view of a region "C" in FIG. 14.
Figure 16:
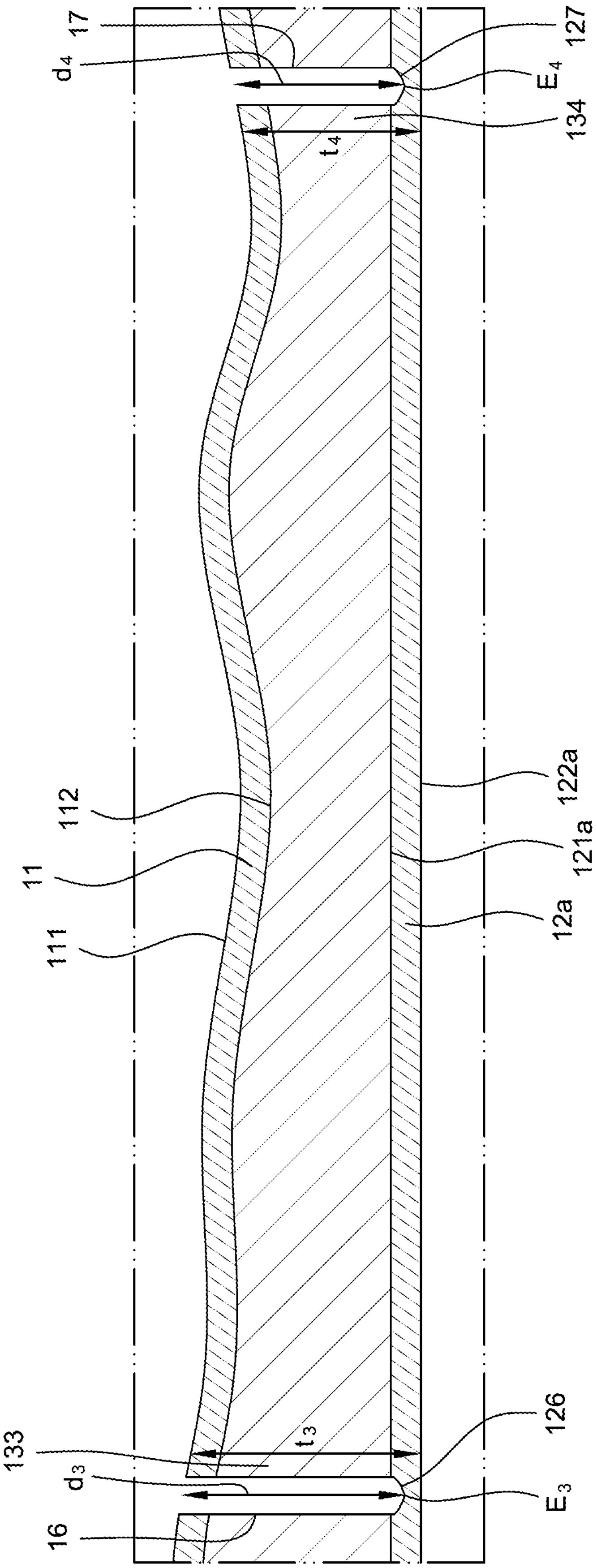
FIG. 16 illustrates a schematic view of one or more stages of an example of a drilling method according to some embodiments of the present disclosure.

FIG. 14 through FIG. 16 illustrate a drilling method according to some embodiments of the present disclosure. The initial stages of the illustrated process are similar to the stages illustrated in FIG. 1 and FIG. 9, except for the structure of the substrate **10*a*. The substrate 10*a* of FIG. 14 is similar to the substrate 10 of FIG. 2, except for the structure of the second conductive layer 12*a*. Both the first conductive surface 121*a* and the second conductive surface 122*a* of the second conductive layer 12*a* are even surfaces and flat surfaces, and they are parallel with each other. The substrate 10*a* may have a third portion 133 (or a first portion) and a fourth portion 134 (or a second portion). The third portion 133 may have a third thickness $t_3$ (or a first thickness). The fourth portion 134** may have a fourth thickness $t_4$ (or a second thickness). The third thickness $t_3$ may be equal to or different from the fourth thickness $t_4$.

Referring to FIG. 14 and FIG. 15, wherein FIG. 15 illustrates an enlarged view of a region "C" in FIG. 14, a third hole 16 (or a first hole) may be formed at the position corresponding to the third portion 133. The process for forming the third hole 16 may be same as or similar to the process for forming the first hole 14 as shown in FIG. 1 through FIG. 9. For example, the third hole 16 may be formed by drilling the substrate **10*a* from a third start point $S_3$ (or first start point) on the first conductive surface 111 of the first conductive layer 11 to a third end point $E_3$ (or first end point) on the first conductive surface 121***a* of the second conductive layer 12*a*. Such drilling process may be accomplished by using the drilling tool 21 of the drilling device 20. The third hole 16 may include a third dimple 126 (or a first dimple) recessed from the first conductive surface 121*a* of the second conductive layer 12*a*. The third start point $S_3$ is defined through a fifth electric signal or a fifth electrical loop generated by the drilling tool 21 contacting the first conductive surface 111 of the first conductive layer 11. In addition, the third end point $E_3$ is defined through a sixth electric signal generated by the drilling tool 21 contacting the first conductive surface 121*a* of the second conductive layer 12*a*. The third end point $E_3$ is located on the first conductive surface 121*a* of the second conductive layer 12*a*.

Then, the drilling device 20 and the drilling tool 21 are moved to a position above or corresponding to the fourth portion 134 of the substrate 10. Then, the drilling tool 21 is moved downward to form a fourth hole 17 (or a second hole) in the substrate 10*a*. The fourth hole 17 may be formed at the position corresponding to the fourth portion 134. The process for forming the fourth hole 17 may be same as or similar to the process for forming the second hole 15 as shown in FIG. 10 through FIG. 13. For example, the fourth hole 17 may be formed by drilling the substrate 10*a* from a fourth start point $S_4$ (or second start point) on the first conductive surface 111 of the first conductive layer 11 to a fourth end point $E_4$ (or second end point) on the first conductive surface 121*a* of the second conductive layer 12*a*. The fourth hole 17 may include a fourth dimple 127 (or a second dimple) recessed from the first conductive surface 121*a* of the second conductive layer 12*a*. The fourth start point $S_4$ is defined through a seventh electric signal or a seventh electrical loop generated by the drilling tool 21 contacting the first conductive surface 111 of the first conductive layer 11. The elevation of the fourth start point $S_4$ may be same as or different form the elevation of the third start point $S_3$. In addition, the fourth end point $E_4$ is defined through an eighth electric signal generated by the drilling tool 21 contacting the first conductive surface 121*a* of the second conductive layer 12*a*. The fourth end point $E_4$ is located on the first conductive surface 121*a* of the second conductive layer 12*a*. The elevation of the fourth end point $E_4$ may be same as the elevation of the third end point $E_3$. An elevation of the fourth dimple 127 may be same as or different from an elevation of the third dimple 126.

Referring to FIG. 16, the drilling device 20 is moved upward so that the drilling tool 21 is removed from the substrate 10*a*. In some embodiments, a fourth depth de of the fourth hole 17 may be equal to or different from the third depth $d_3$ of the third hole 16.

Figure 17:
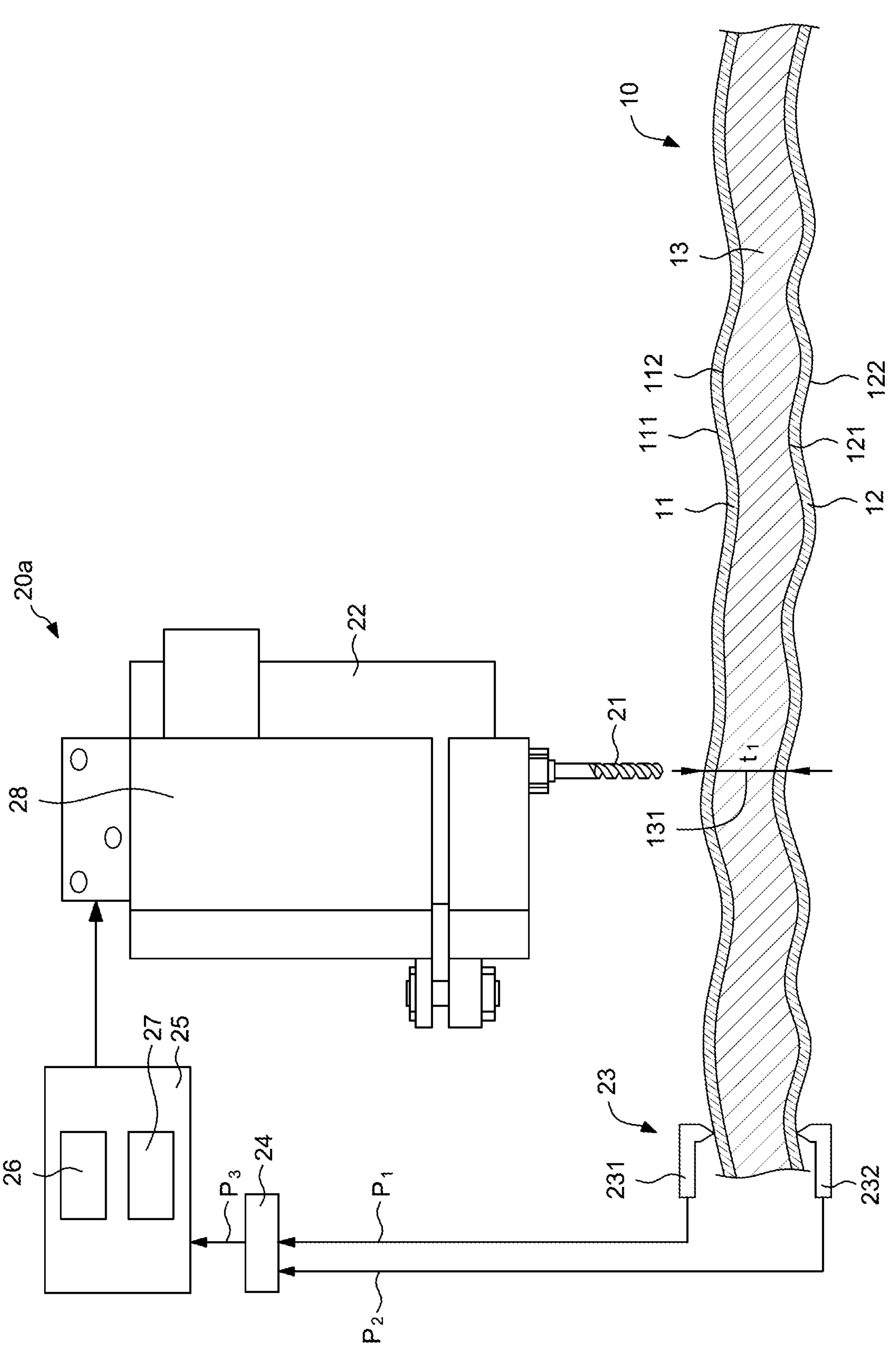
FIG. 17 illustrates a schematic view of a drilling device according to some embodiments of the present disclosure.

FIG. 17 illustrates a schematic view of a drilling device 20*a* according to some embodiments of the present disclosure. The drilling device 20*a* of FIG. 17 may be same as the drilling device 20 of FIG. 2, except that the record unit 26 and the data processing unit 27 are included in the control unit 25.

Figure 18:
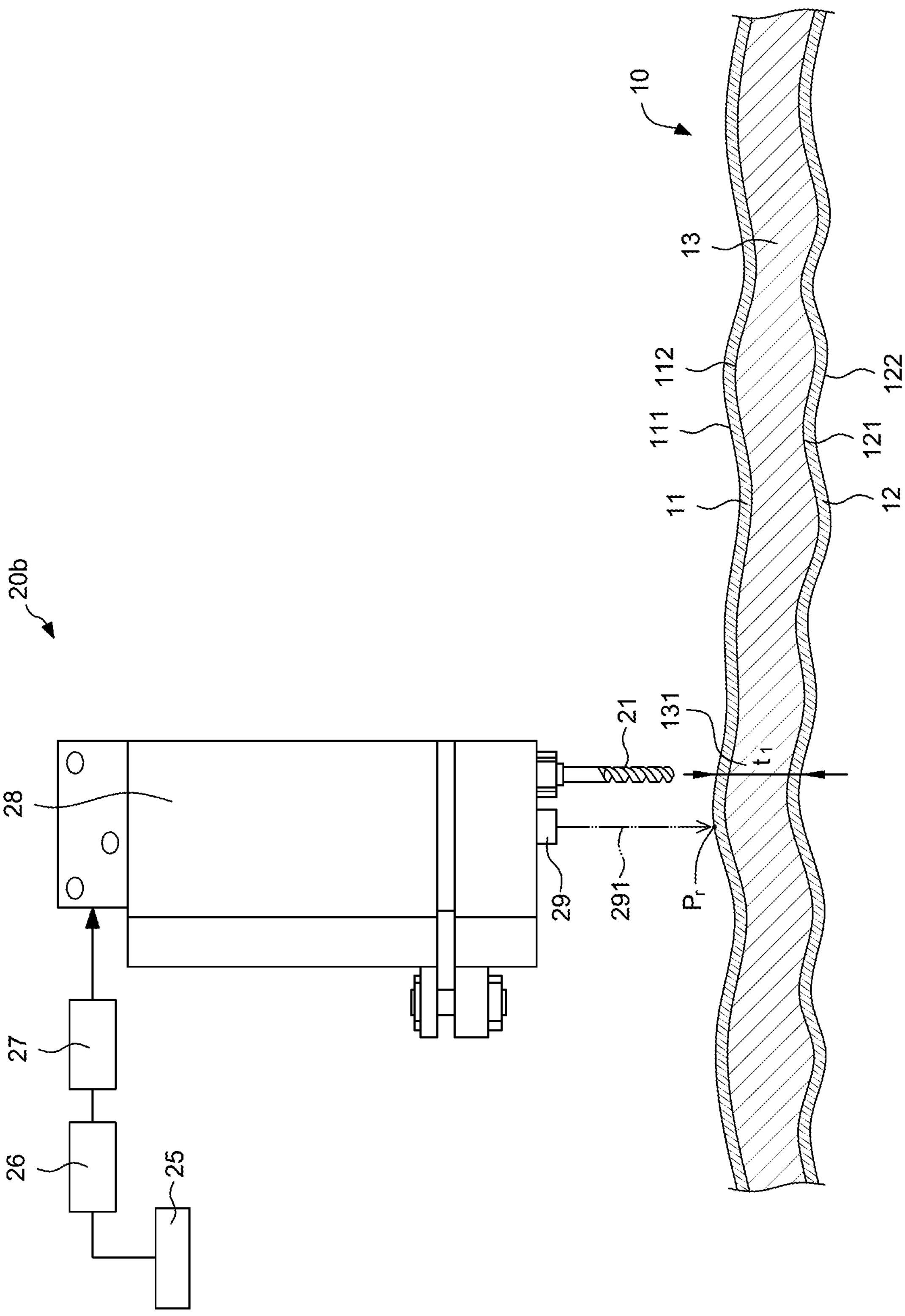
FIG. 18 illustrates a schematic view of a drilling device according to some embodiments of the present disclosure.

FIG. 18 illustrates a schematic view of a drilling device 20*b* according to some embodiments of the present disclosure. The drilling device 20*b* of FIG. 18 may be same as the drilling device 20 of FIG. 2, except that the current source 22, the conductive element 23 and the signal receiver 24 of FIG. 2 are omitted, and a distance measurement device 29 is further included. The distance measurement device 29 may be a laser rangefinder. The distance measurement device 29 may be attached to the device body 28, and may be very close to the drilling tool 21. The distance measurement device 29 may emit a laser beam to the first conductive surface 111 of the first conductive layer 11 to determine an elevation of the reference point $P_r$. The position of the reference point $P_r$ is very close to the first start point $S_1$ (FIG. 4). In some embodiments, the reference point $P_r$ may be considered as the first start point St. Thus, the elevation of the reference point $P_r$ (or the first start point $S_1$) may be determined by optical means, and may be recorded in the record unit 26.

Figure 19:
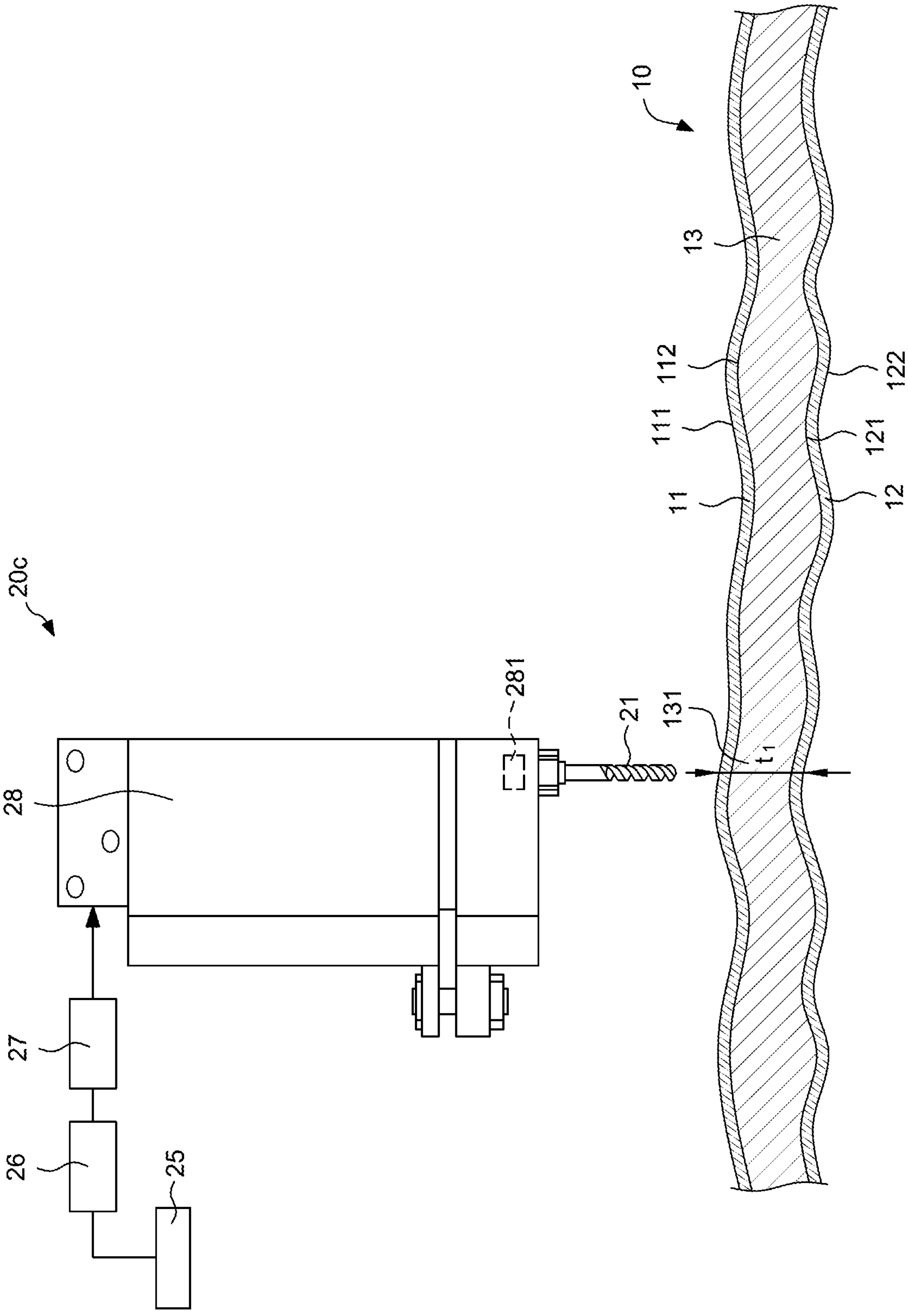
FIG. 19 illustrates a schematic view of a drilling device according to some embodiments of the present disclosure.

FIG. 19 illustrates a schematic view of a drilling device 20*c* according to some embodiments of the present disclosure. The drilling device 20*c* of FIG. 19 may be same as the drilling device 20 of FIG. 2, except that the current source 22, the conductive element 23 and the signal receiver 24 of FIG. 2 are omitted, and a force sensor 281 is further included. The force sensor 281 may be a load measuring device such as a load cell, and may be disposed in the device body 28. The force sensor 281 may be connected to the drilling tool 21. When the drilling tool 21 moves downward to contact the first conductive surface 111 of the first conductive layer 11 at the first start point $S_1$ (FIG. 4), the force sensor 281 may sense a reaction force from the drilling tool 21 and determine an elevation of the first start point $S_1$ (FIG. 4). Thus, the elevation of the first start point $S_1$ may be determined by physical contact, and may be recorded in the record unit 26.

Figures 20A, 20B, 20C:
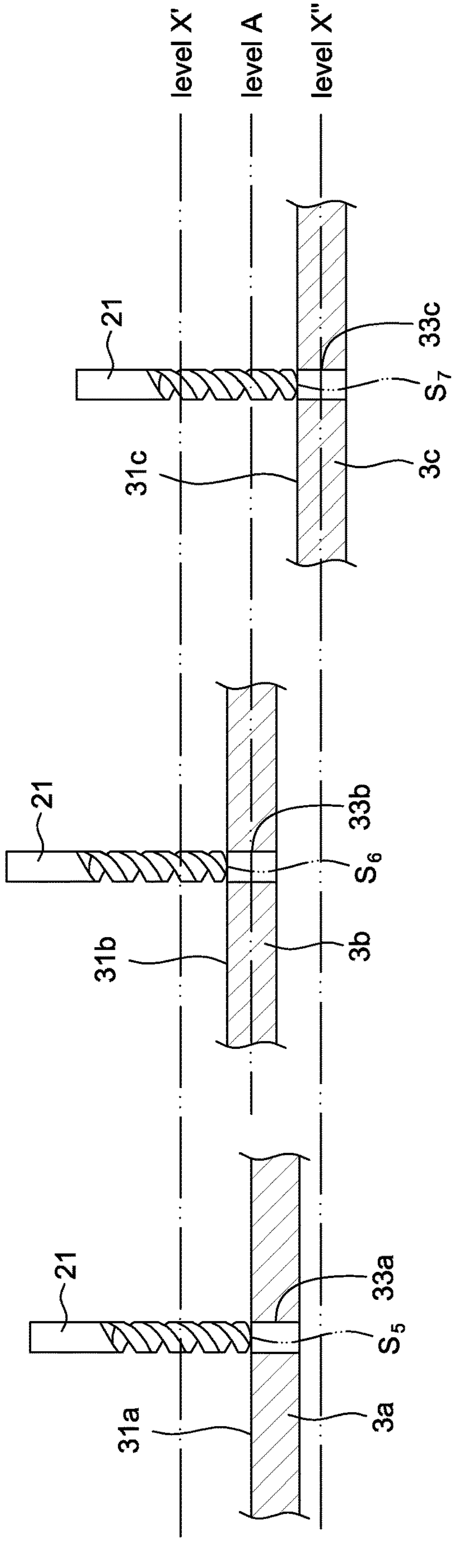
FIG. 20A illustrates a schematic view of a first operation situation of the drilling tool according to some embodiments of the present disclosure.
FIG. 20B illustrates a schematic view of a second operation situation of the drilling tool according to some embodiments of the present disclosure.
FIG. 20C illustrates a schematic view of a third operation situation of the drilling tool according to some embodiments of the present disclosure.

FIG. 20A illustrates a schematic view of a first operation situation of the drilling tool 21 according to some embodiments of the present disclosure. As shown in FIG. 20A, a level A represents a predetermined standard level or a desired elevation. A level X' represents a level or an elevation higher than the level A. The difference (or distance) between the level X' and the level A is an acceptable value. For example, the difference (or distance) between the level X' and the level A may be predetermined as 5% of a thickness of a workpiece. The level X' may be considered as a top limit of a tolerance or a deviation of the level A. Any level or elevation located in a range between the level X' and the level A is still acceptable and is within specification. In addition, a level X" represents a level or an elevation lower than the level A. The difference (or distance) between the level X" and the level A is an acceptable value. For example, the difference (or distance) between the level X" and the level A may be predetermined as 5% of a thickness of a workpiece. The level X" may be considered as a bottom limit of the tolerance or the deviation of the level A. Any level or elevation located in a range between the level X" and the level A is still acceptable and is within specification. In addition, any level or elevation located outside a range between the level X" and the level X' is unacceptable and is out of specification.

As shown in FIG. 20A, a segment 3*a* may have a top surface 31*a*. The segment 3*a* may be a portion of a workpiece. The drilling tool 21 may contact the top surface 31*a* of the segment 3*a* at a start point $S_5$. The elevation of the start point $S_5$ may be detected or determined by the method shown in FIG. 4, FIG. 17, FIG. 18 or FIG. 19, and may be recorded in the record unit 26. Then, a comparison result executed by the data processing unit 27 shows that the elevation of the start point $S_5$ is same as the elevation of the level A. Then, the drilling tool 21 may move downward to remove a portion of the segment 3*a* to form a hole 33*a*. The downward moving distance of the drilling tool 21 is also referred to as the drilling depth (or stroke). For example, the drilling depth (or stroke) of the drilling tool 21 may be a thickness of the segment 3*a*. For example, the drilling depth (or stroke) of the drilling tool 21 may be a depth of the hole 33*a*. In some embodiments, the downward moving distance or the drilling depth of the drilling tool 21 may be predetermined.

FIG. 20B illustrates a schematic view of a second operation situation of the drilling tool 21 according to some embodiments of the present disclosure. As shown in FIG. 20B, a segment 3*b* may have a top surface 31*b*. The segment 3*b* may be a portion of a workpiece. The drilling tool 21 may contact the top surface 31*b* of the segment 3*b* at a start point $S_6$. The elevation of the start point $S_6$ may be detected or determined by the method shown in FIG. 4, FIG. 17, FIG. 18 or FIG. 19, and may be recorded in the record unit 26. Then, a comparison result executed by the data processing unit 27 shows that the elevation of the start point $S_6$ is higher than the elevation of the level A and is lower than the level X'. That is, the tip of the drilling tool 21 contacts the segment 3*b* before the tip of the drilling tool 21 is lowered to or reaches to the level A. Further, the elevation of the start point $S_6$ is acceptable since it is located in the range between the level X' and the level A. Then, the drilling tool 21 may move downward to remove a portion of the segment 3*b* to form a hole 33*b*. The downward moving distance of the drilling tool 21 is also referred to as the drilling depth (or stroke). For example, the drilling depth (or stroke) of the drilling tool 21 may be a thickness of the segment 3*b*. For example, the drilling depth (or stroke) of the drilling tool 21 may be a depth of the hole 33*b*. In some embodiments, the downward moving distance or the drilling depth of the drilling tool 21 may be predetermined. In some embodiments, the drilling depth of the drilling tool 21 in FIG. 20B may be equal to the drilling depth of the drilling tool 21 in FIG. 20A.

FIG. 20C illustrates a schematic view of a third operation situation of the drilling tool 21 according to some embodiments of the present disclosure. As shown in FIG. 20C, a segment 3*c* may have a top surface 31*c*. The segment 3*c* may be a portion of a workpiece. The drilling tool 21 may contact the top surface 31*c* of the segment 3*c* at a start point $S_7$. The elevation of the start point $S_7$ may be detected or determined by the method shown in FIG. 4, FIG. FIG. 18 or FIG. 19, and may be recorded in the record unit 26. Then, a comparison result executed by the data processing unit 27 shows that the elevation of the start point $S_7$ is lower than the elevation of the level A and is higher than the level X". That is, the tip of the drilling tool 21 move beyond the level A to contact the segment 3*c*. Further, the elevation of the start point $S_7$ is acceptable since it is located in the range between the level X" and the level A. Then, the drilling tool 21 may move downward to remove a portion of the segment 3*c* to form a hole 33*c*. The downward moving distance of the drilling tool 21 is also referred to as the drilling depth (or stroke). For example, the drilling depth (or stroke) of the drilling tool 21 may be a thickness of the segment 3*c*. For example, the drilling depth (or stroke) of the drilling tool 21 may be a depth of the hole 33*c*. In some embodiments, the downward moving distance or the drilling depth of the drilling tool 21 may be predetermined. In some embodiments, the drilling depth of the drilling tool 21 in FIG. 20C may be equal to the drilling depth of the drilling tool 21 in FIG. 20A.

Figures 21A, 21B:
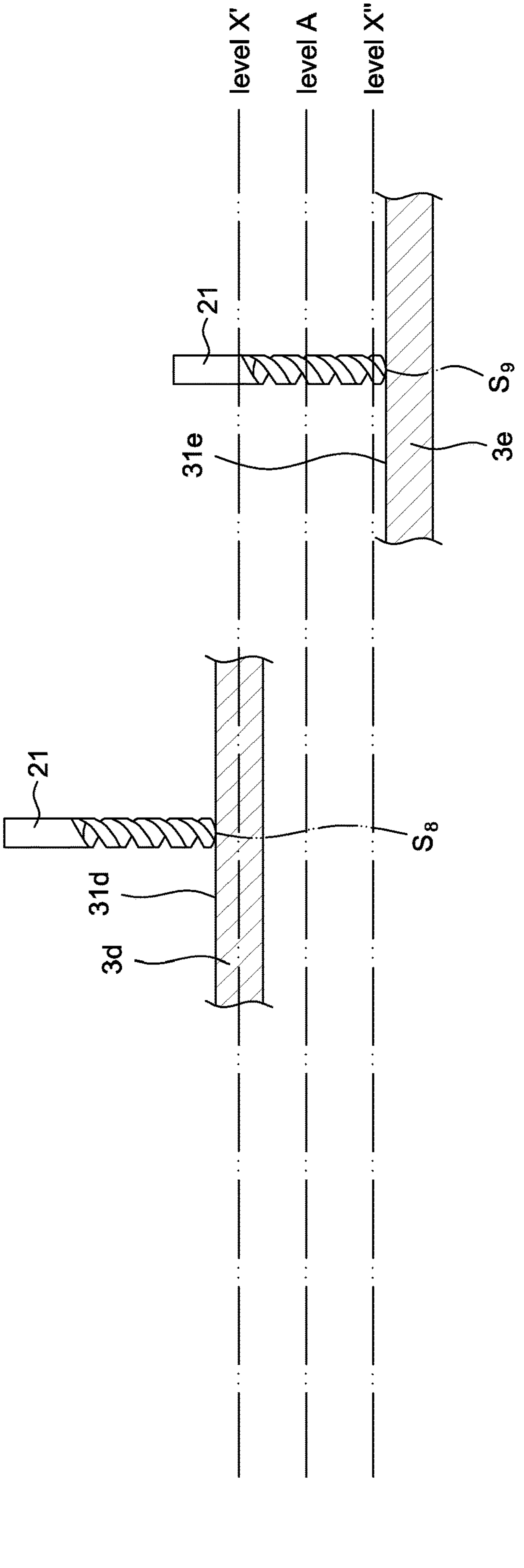
FIG. 21A illustrates a schematic view of a fourth operation situation of the drilling tool according to some embodiments of the present disclosure.
FIG. 21B illustrates a schematic view of a fifth operation situation of the drilling tool according to some embodiments of the present disclosure.

FIG. 21A illustrates a schematic view of a fourth operation situation of the drilling tool 21 according to some embodiments of the present disclosure. The level A, the level X' and the level X" of FIG. 21A are same as the level A, the level X' and the level X" of FIG. 20A, respectively. As shown in FIG. 21A, a segment 3*d* may have a top surface 31*d*. The segment 3*d* may be a portion of a workpiece. The drilling tool 21 may contact the top surface 31*d* of the segment 3*d* at a start point $S_8$. The elevation of the start point $S_8$ may be detected or determined by the method shown in FIG. 4, FIG. FIG. 18 or FIG. 19, and may be recorded in the record unit 26. Then, a comparison result executed by the data processing unit 27 shows that the elevation of the start point $S_8$ is higher than the elevation of the level X'. That is, the tip of the drilling tool 21 contacts the segment 3*d* before the tip of the drilling tool 21 is lowered to or reaches to the level X'. Further, the elevation of the start point $S_8$ is unacceptable and is out of specification since it is located outside the range between the level X" and the level X'. Thus, the drilling tool 21 may not further move downward. The segment 3*d* may be not drilled at the start point $S_8$. In some embodiments, the data processing unit 27 may further generate an alarm signal to inform the operator. Such alarm signal may be recorded in the record unit 26.

FIG. 21B illustrates a schematic view of a fifth operation situation of the drilling tool 21 according to some embodiments of the present disclosure. As shown in FIG. 21B, a segment 3*e* may have a top surface 31*e*. The segment 3*e* may be a portion of a workpiece. The drilling tool 21 may contact the top surface 31*e* of the segment 3*e* at a start point $S_9$. The elevation of the start point $S_9$ may be detected or determined by the method shown in FIG. 4, FIG. FIG. 18 or FIG. 19, and may be recorded in the record unit 26. Then, a comparison result executed by the data processing unit 27 shows that the elevation of the start point $S_9$ is lower than the elevation of the level X". That is, the tip of the drilling tool 21 move beyond the level X" to contact the segment 3*e*. Further, the elevation of the start point $S_9$ is unacceptable and is out of specification since it is located outside the range between the level X" and the level X'. Thus, the drilling tool 21 may not further move downward. The segment 3*e* may be not drilled at the start point $S_9$. In some embodiments, the data processing unit 27 may further generate an alarm signal to inform the operator. Such alarm signal may be recorded in the record unit 26.

FIG. 22 through FIG. 29 illustrate a method for forming at least one conductive via in a workpiece 40 according to some embodiments of the present disclosure.

Figure 22:
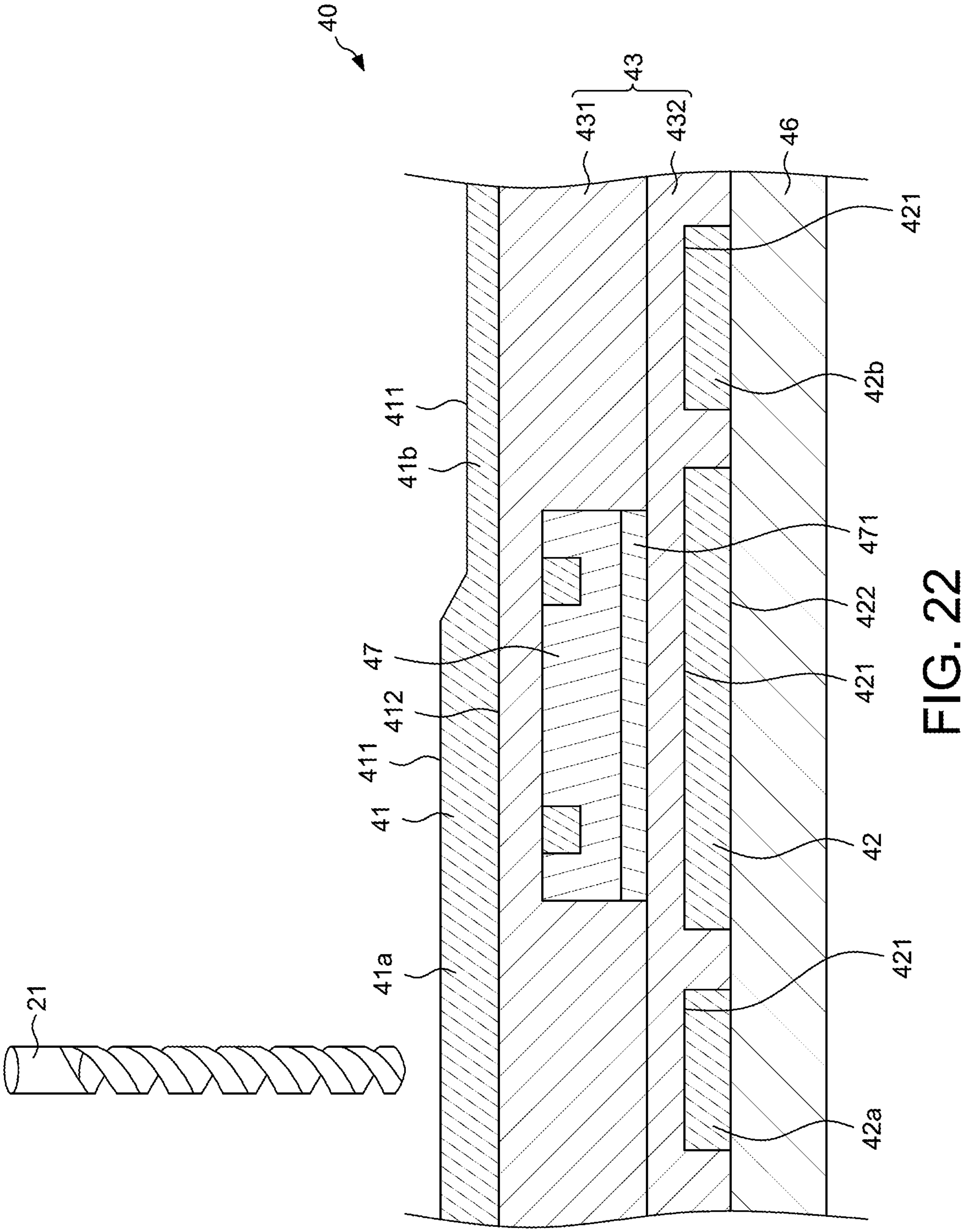
FIG. 22 illustrates a schematic view of one or more stages of an example of a method for forming at least one conductive via in a workpiece according to some embodiments of the present disclosure.

Referring to FIG. 22, a workpiece 40 is provided. The workpiece 40 may be, for example, a substrate (e.g., the substrate 10 of FIG. 2), a semiconductor package structure or a printed circuit board (PCB). The workpiece 40 may include a first conductive layer 41, a second conductive layer 42, a base layer 46, a dielectric structure 43 and an electronic device 47. The first conductive layer 41 may be, for example, a metal layer or a circuit layer. The first conductive layer 41 has a first conductive surface 411 and a second conductive surface 412 opposite to the first conductive surface 411. The first conductive surface 411 of the first conductive layer 41 may be a top surface of the workpiece 40. The first conductive layer 41 may include a first portion 41*a* and a second portion 41*b*. A thickness of the first portion 41*a* is greater than a thickness of the second portion 41*b* Thus, the first conductive layer 41 may have a non-uniform thickness or an inconsistent thickness. The first conductive surface 411 of the first conductive layer 41 may be an uneven surface.

The second conductive layer 42 may be longitudinally spaced apart from the first conductive layer 41. The second conductive layer 42 may be, for example, a metal layer or a circuit layer, and may be disposed on the base layer 46. The second conductive layer 42 has a first conductive surface 421 and a second conductive surface 422 opposite to the first conductive surface 421. The second conductive layer 42 may include a first portion 42*a* and a second portion 42*b*. The first portion 42*a* of the second conductive layer 42 may correspond to the first portion 41*a* of the first conductive layer 41. The second portion 42*b* of the second conductive layer 42 may correspond to the second portion 41*b* of the first conductive layer 41. A thickness of the first portion 42*a* of the second conductive layer 42 may be equal to or different from a thickness of a thickness of the second portion 42*b* of the second conductive layer 42.

The dielectric structure 43 may be disposed between the first conductive layer 41 and the base layer 46. In some embodiments, the dielectric structure 43 may include a first layer 431 and a second layer 432. The second layer 432 may be formed or disposed on the base layer 46 to cover the second conductive layer 42. The electronic device 47 may be attached to or adhered to the second layer 432 through an adhesion layer 471. The first layer 431 may be formed or disposed on the second layer 432 to cover the electronic device 47. The first conductive layer 41 may be formed or disposed on the first layer 431.

Then, a drilling tool 21 of a drilling device 20 (FIG. 2) may be disposed above the first portion 41*a* of the first conductive layer 41 of the workpiece 40. The first conductive element 231 (FIG. 2) of the drilling device 20 may contact or may be electrically connected to the first conductive surface 411 of the first conductive layer 41. The second conductive element 232 (FIG. 2) of the drilling device 20 may contact or may be electrically connected to the second conductive surface 422 of the second conductive layer 42.

Figure 23:
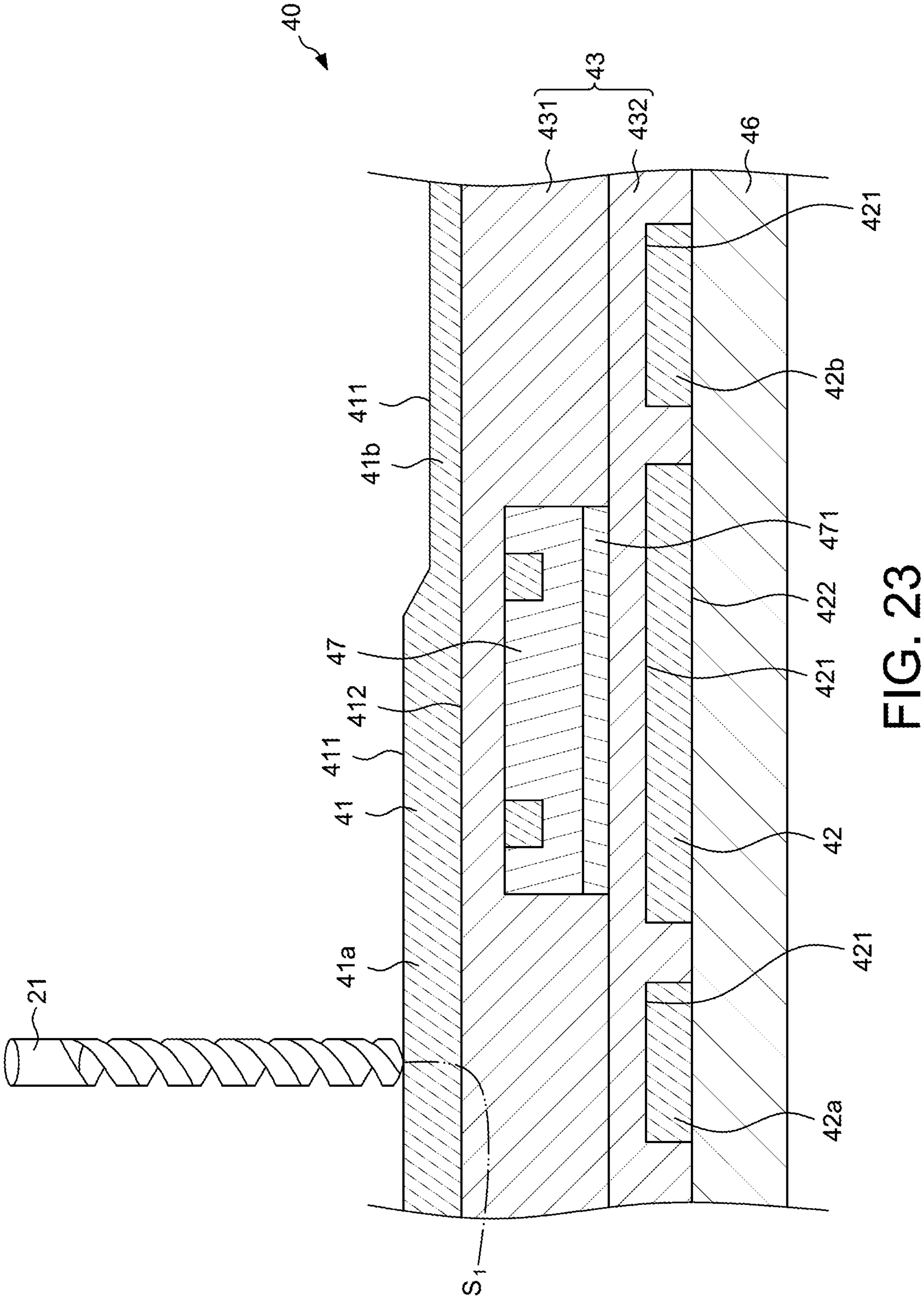
FIG. 23 illustrates a schematic view of one or more stages of an example of a method for forming at least one conductive via in a workpiece according to some embodiments of the present disclosure.

Referring to FIG. 23, the drilling tool 21 is moved to contact the workpiece 40. A first start point $S_1$ is defined through a first electric signal generated by the drilling tool 21 contacting the first conductive surface 411 of the first portion 41*a* of the first conductive layer 41. Meanwhile, a first electrical loop is formed through electrical connections of the drilling tool 21, the first conductive surface 411 of the first conductive layer 41, the first conductive element 231 (FIG. 2) and the current source 22 (FIG. 2). In some embodiments, the first electrical loop may generate the first electric signal. In some embodiments, when the first electrical loop and the first electric signal are generated, the drilling tool 21 starts to rotate so as to start the drilling process or drilling operation.

Figure 24:
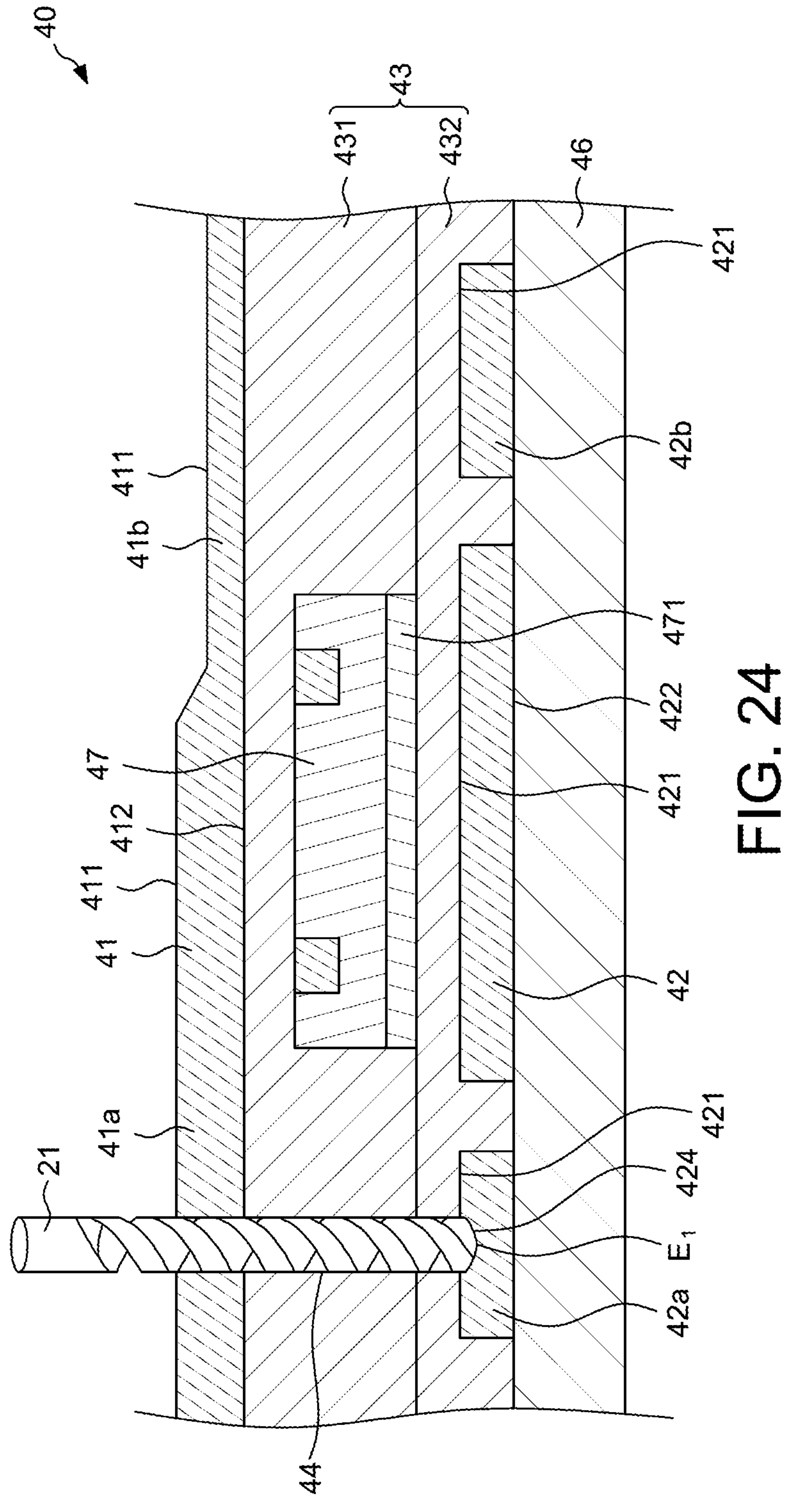
FIG. 24 illustrates a schematic view of one or more stages of an example of a method for forming at least one conductive via in a workpiece according to some embodiments of the present disclosure.

Referring to FIG. 24, the drilling tool 21 is moved downward to penetrate through the first conductive layer 41 and the dielectric structure 43, and contact the first conductive surface 421 of the first portion 42*a* of the second conductive layer 42. A first end point $E_1$ is defined through a second electric signal generated by the drilling tool 21 contacting the first conductive surface 421 of the first portion 42*a* of the second conductive layer 42. The first end point $E_1$ is located on the first conductive surface 421 of the first portion 42*a* of the second conductive layer 42. Meanwhile, a second electrical loop is formed through electrical connections of the drilling tool 21, the second conductive surface 422 of the second conductive layer 42, the second conductive element 232 (FIG. 2) and the current source 22 (FIG. 2). In some embodiments, the second electrical loop may generate the second electric signal. In addition, the second electric signal is generated after the first electric signal disappears. Thus, there is a time difference between the second electric signal and the first electric signal. In some embodiments, when the second electrical loop and the second electric signal are generated, the drilling tool 21 may stop to rotate so as to stop the drilling process or drilling operation. Thus, the drilling process or the drilling operation of the drilling tool 21 may stop at the first end point $E_1$ of second conductive layer 12.

In some embodiments, a first dimple 424 may be formed on the first conductive surface 421 of the second conductive layer 42. The first dimple 424 may be recessed from the first conductive surface 421 of the second conductive layer 42. The first end point $E_1$ may be a bottom end of the first dimple 424. In some embodiments, a first drilling depth (or stroke) of the drilling tool 21 may be determined according to a distance between the first start point $S_1$ and the first end point $E_1$.

Figure 25:
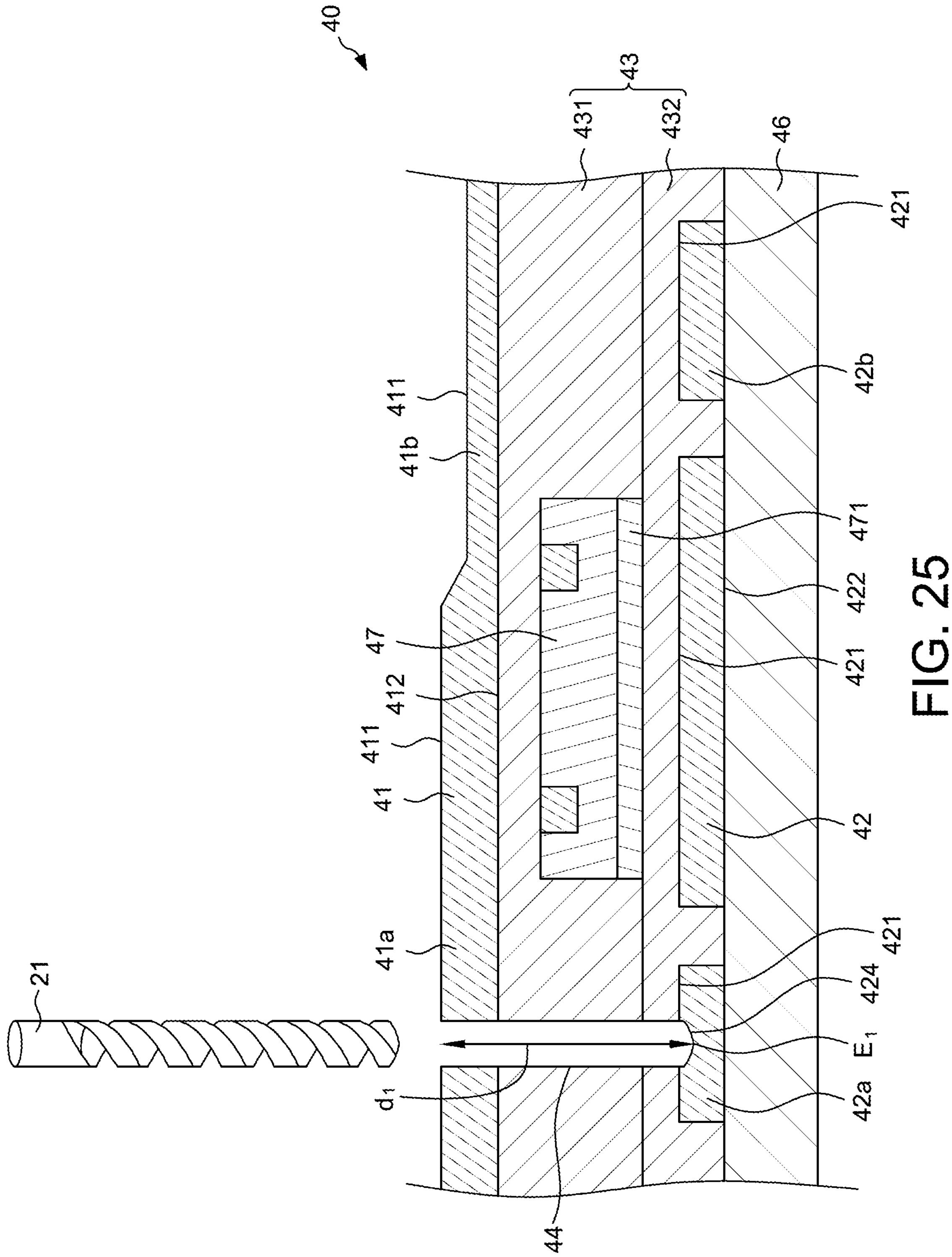
FIG. 25 illustrates a schematic view of one or more stages of an example of a method for forming at least one conductive via in a workpiece according to some embodiments of the present disclosure.

Referring to FIG. 25, the drilling device 20 is moved upward so that the drilling tool 21 is removed from the workpiece 40 so as to form a first hole 44 in the workpiece 40. The first hole 44 may stop at the first portion 42*a* of the second conductive layer 42. The first hole 44 may include the first dimple 424. The first hole 44 may be a blind hole that does not extend through the first portion 42*a* of the second conductive layer 42. The first hole 44 may have a first depth $d_1$. The first depth $d_1$ of the first hole 44 may be substantially equal to the first drilling depth (or stroke) of the drilling tool 21.

Figure 26:
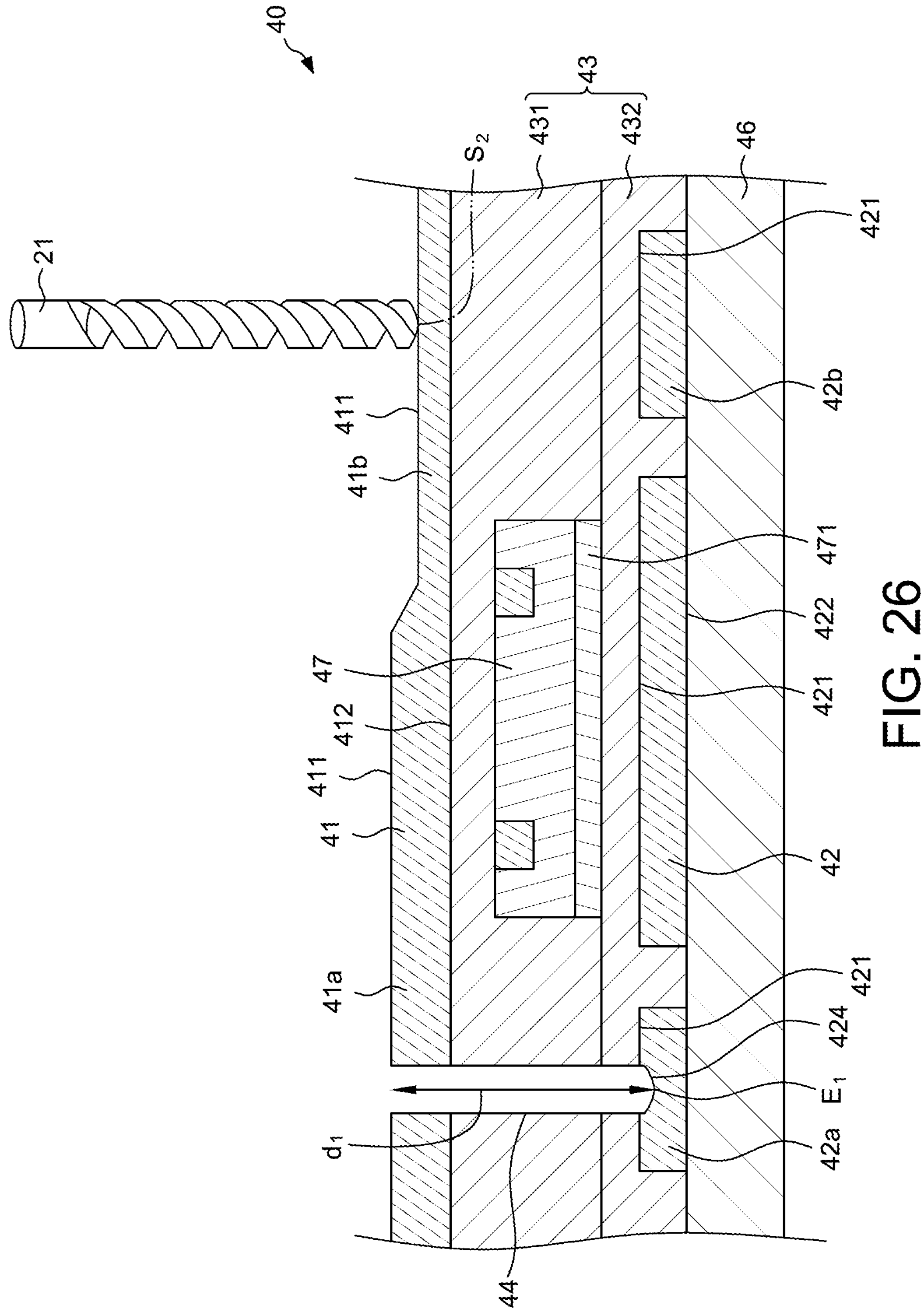
FIG. 26 illustrates a schematic view of one or more stages of an example of a method for forming at least one conductive via in a workpiece according to some embodiments of the present disclosure.

Referring to FIG. 26, the drilling device 20 and the drilling tool 21 are moved to a position above or corresponding to a second portion 41*b* of the workpiece 40. Then, the drilling tool 21 is moved downward to contact the workpiece 40. A second start point $S_2$ is defined through a third electric signal generated by the drilling tool 21 contacting the first conductive surface 411 of the first conductive layer 41. The elevation of the second start point $S_2$ may be lower than the elevation of the first start point $S_1$. Meanwhile, a third electrical loop is formed through electrical connections of the drilling tool 21, the first conductive surface 411 of the first conductive layer 41, the first conductive element 231 and the current source 22. In some embodiments, the third electrical loop may generate the third electric signal. In some embodiments, the third electrical loop and the third electric signal may be same as or similar to the first electrical loop and the first electric signal, respectively. In some embodiments, when the third electrical loop and the third electric signal are generated, the drilling tool 21 starts to rotate so as to start the drilling process or drilling operation.

Figure 27:
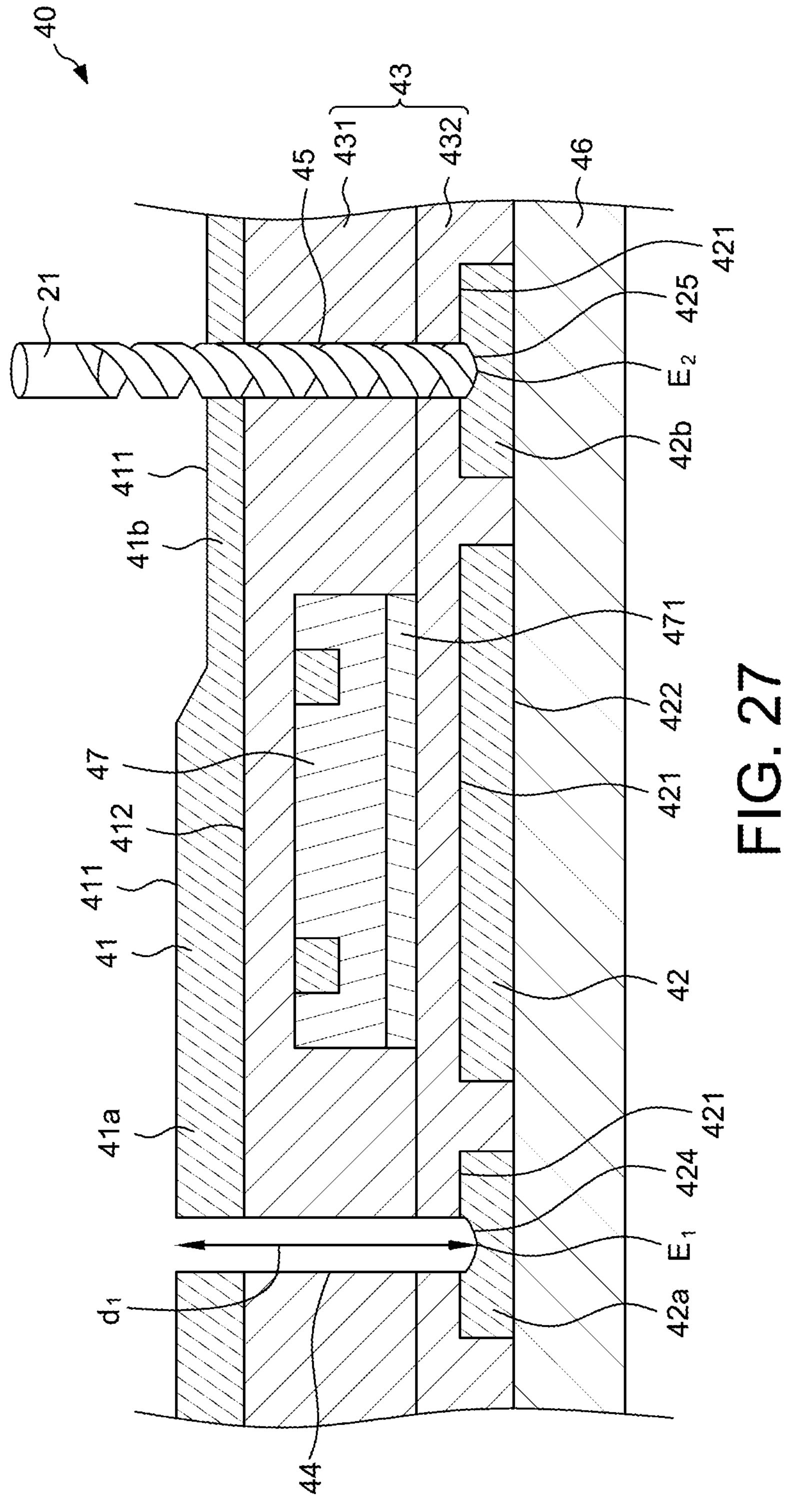
FIG. 27 illustrates a schematic view of one or more stages of an example of a method for forming at least one conductive via in a workpiece according to some embodiments of the present disclosure.

Referring to FIG. 27, the drilling tool 21 is moved downward to penetrate through the first conductive layer 41 and the dielectric structure 43. A second end point $E_2$ is defined through a fourth electric signal generated by the drilling tool 21 contacting the first conductive surface 421 of the second portion 42*b* of the second conductive layer 42. The second end point $E_2$ is located on the first conductive surface 421 of the second portion 42*b* of the second conductive layer 42. The elevation of the second end point $E_2$ may be same as or different form the elevation of the first end point $E_1$. Meanwhile, a fourth electrical loop is formed through electrical connections of the drilling tool 21, the first conductive surface 421 of the second conductive layer 42, the second conductive element 232 and the current source 22. In some embodiments, the fourth electrical loop may generate the fourth electric signal. In some embodiments, the fourth electrical loop and the fourth electric signal may be same as or similar to the second electrical loop and the second electric signal, respectively. In addition, the fourth electric signal is generated after the third electric signal disappears. Thus, there is a time difference between the fourth electric signal and the third electric signal. In some embodiments, when the fourth electrical loop and the fourth electric signal are generated, the drilling tool 21 may stop to rotate so as to stop the drilling process or drilling operation.

Thus, the drilling process or the drilling operation of the drilling tool 21 may stop at the second end point $E_2$ of second conductive layer 42.

In some embodiments, a second dimple 425 may be formed on the first conductive surface 421 of the second portion 42*b* of the second conductive layer 42. The second dimple 425 may be recessed from the first conductive surface 421 of the second conductive layer 42. An elevation of the second dimple 425 may be same as or different from an elevation of the first dimple 424. In some embodiments, a second drilling depth (or stroke) of the drilling tool 21 may be determined according to a distance between the second start point $S_2$ and the second end point $E_2$.

Figure 28:
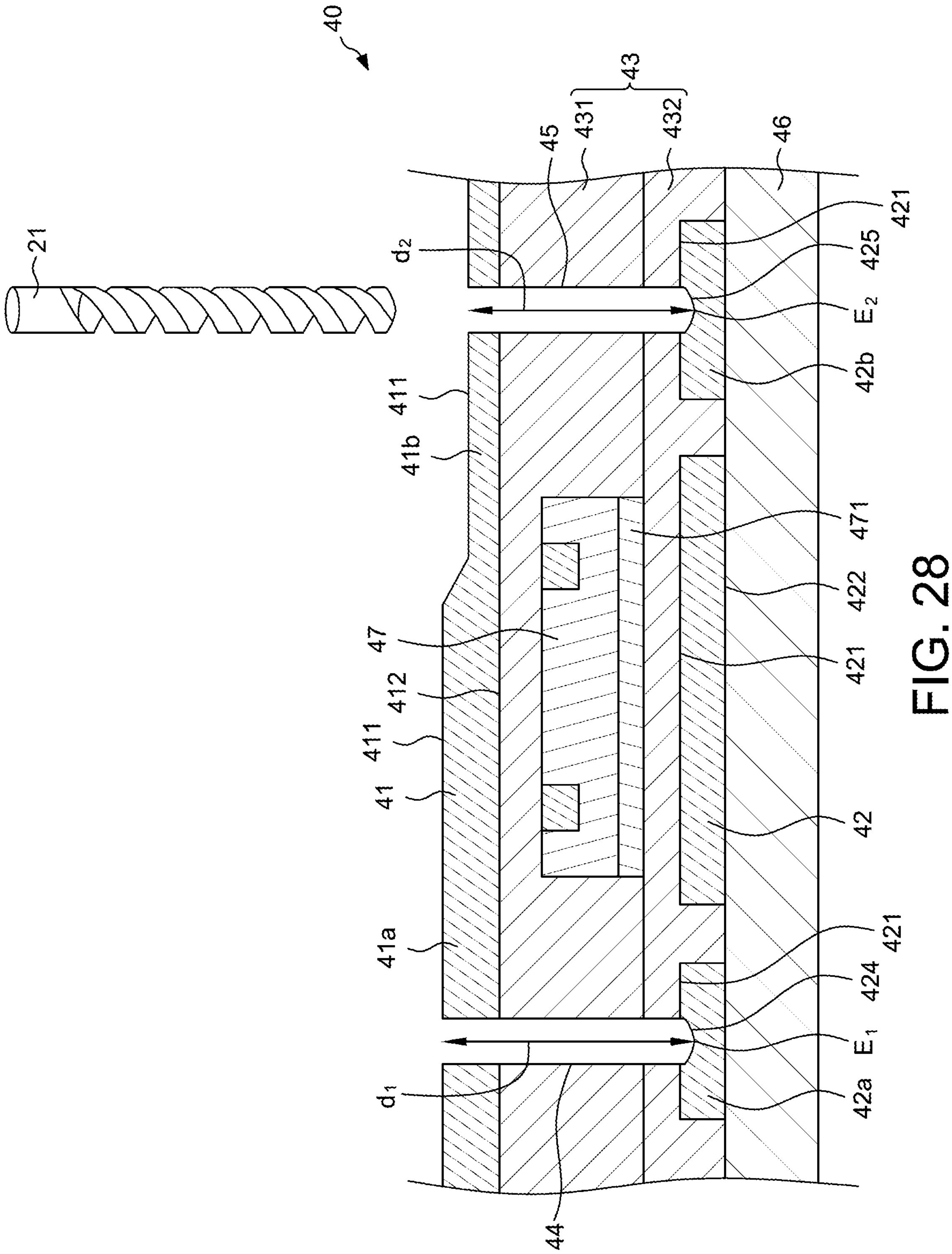
FIG. 28 illustrates a schematic view of one or more stages of an example of a method for forming at least one conductive via in a workpiece according to some embodiments of the present disclosure.

Referring to FIG. 28, the drilling tool 21 is removed from the workpiece 40 so as to form a second hole 45 in the workpiece 40. The second hole 45 may stop at the second conductive layer 22. The second hole 45 may include the second dimple 425. The second hole 45 may be a blind hole that does not extend through the second conductive layer 42. The second hole 45 may have a second depth $d_2$. In some embodiments, the second depth $d_2$ of the second hole 45 may be less than the first depth $d_1$ of the first hole 44.

Figure 29:
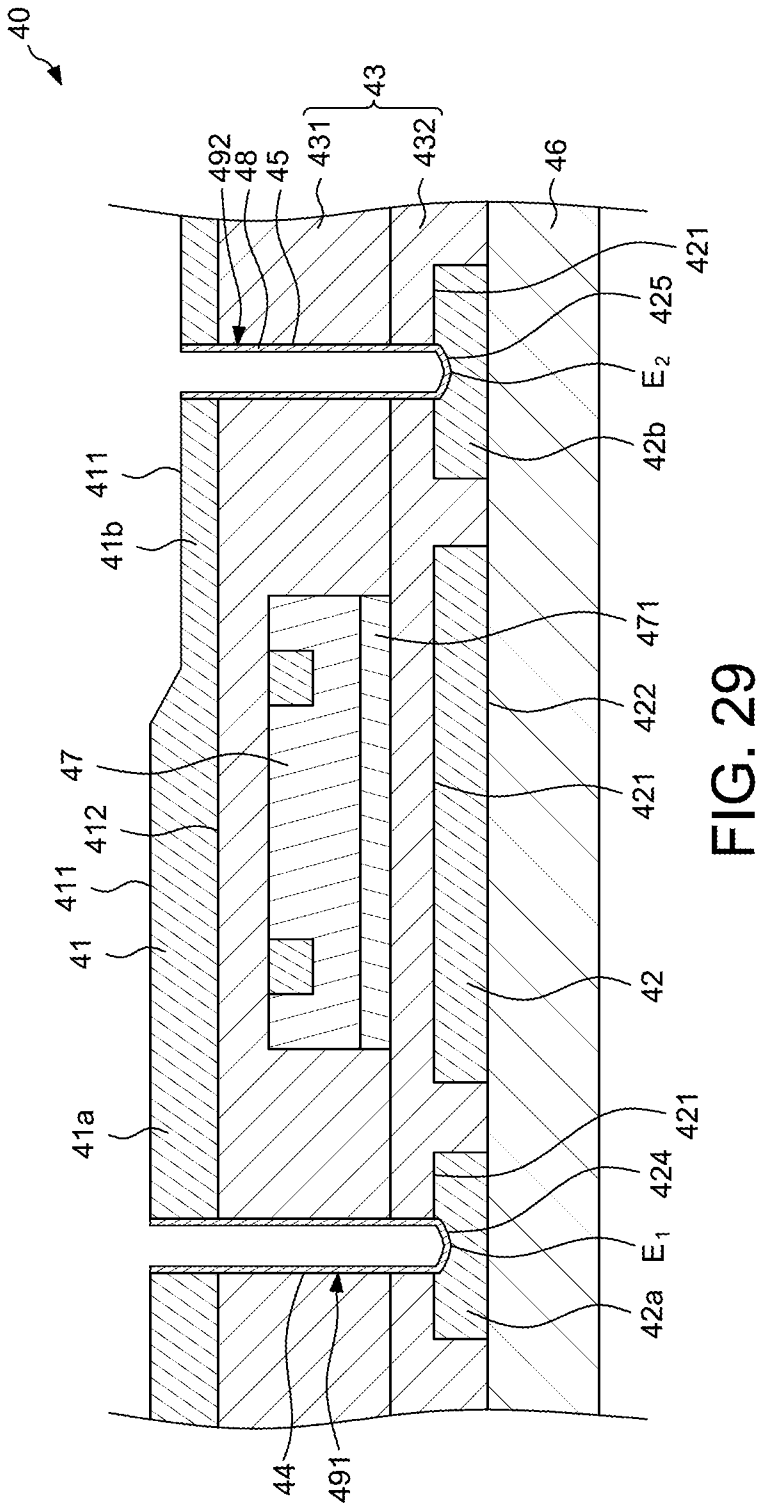
FIG. 29 illustrates a schematic view of one or more stages of an example of a method for forming at least one conductive via in a workpiece according to some embodiments of the present disclosure.

Referring to FIG. 29, a conductive material 48 (e.g., copper) may be formed on the sidewalls of the first hole 44 and the second hole 45 by, for example, deposition, coating or plating. For example, a first portion of the conductive material 48 may be formed on the sidewall of the first hole 44 so as to form a first conductive via 491 that electrically connects the first portion 41*a* of the first conductive layer 41 and the first portion 42*a* of the second conductive layer 42. A second portion of the conductive material 48 may be formed on the sidewall of the second hole 45 so as to form a second conductive via 492 that electrically connects the second portion 41*b* of the first conductive layer 41 and the second portion 42*b* of the second conductive layer 42. Since the first hole 44 and the second hole 45 may be formed precisely, the electrical connections between the first portion 41*a* of the first conductive layer 41 and the first portion 42*a* of the second conductive layer 42 and between the second portion 41*b* of the first conductive layer 41 and the second portion 42*b* of the second conductive layer 42 are ensured.

Figure 30:
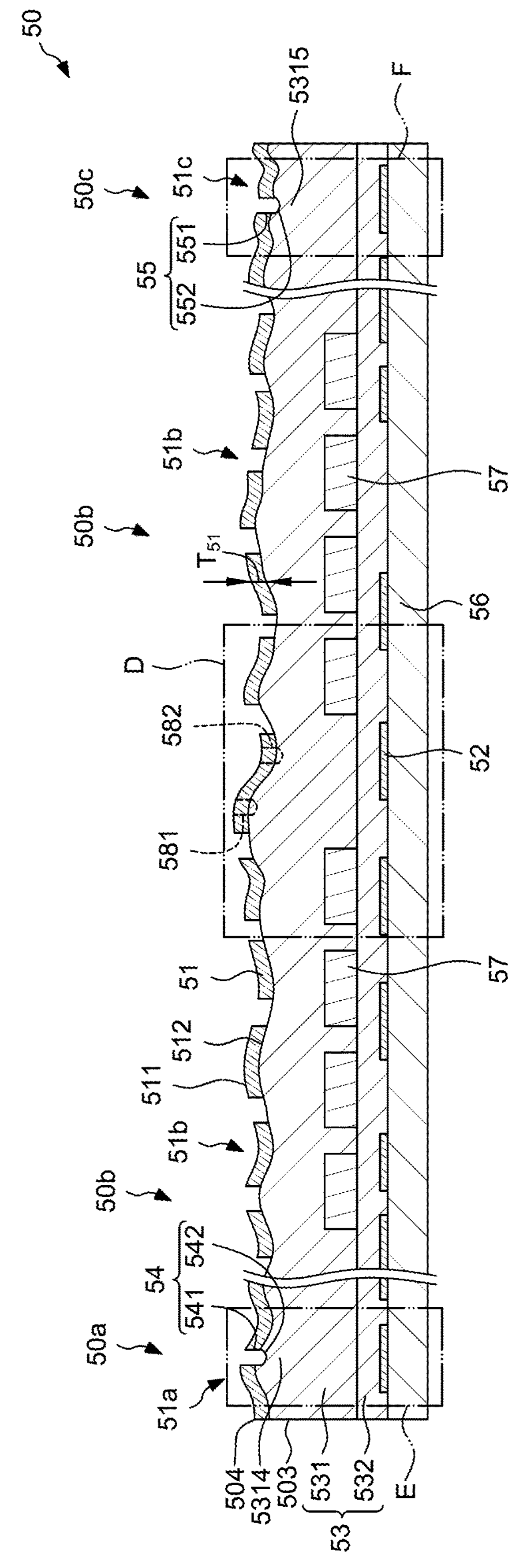
FIG. 30 illustrates a schematic view of a substrate according to some embodiments of the present disclosure.
Figure 31:
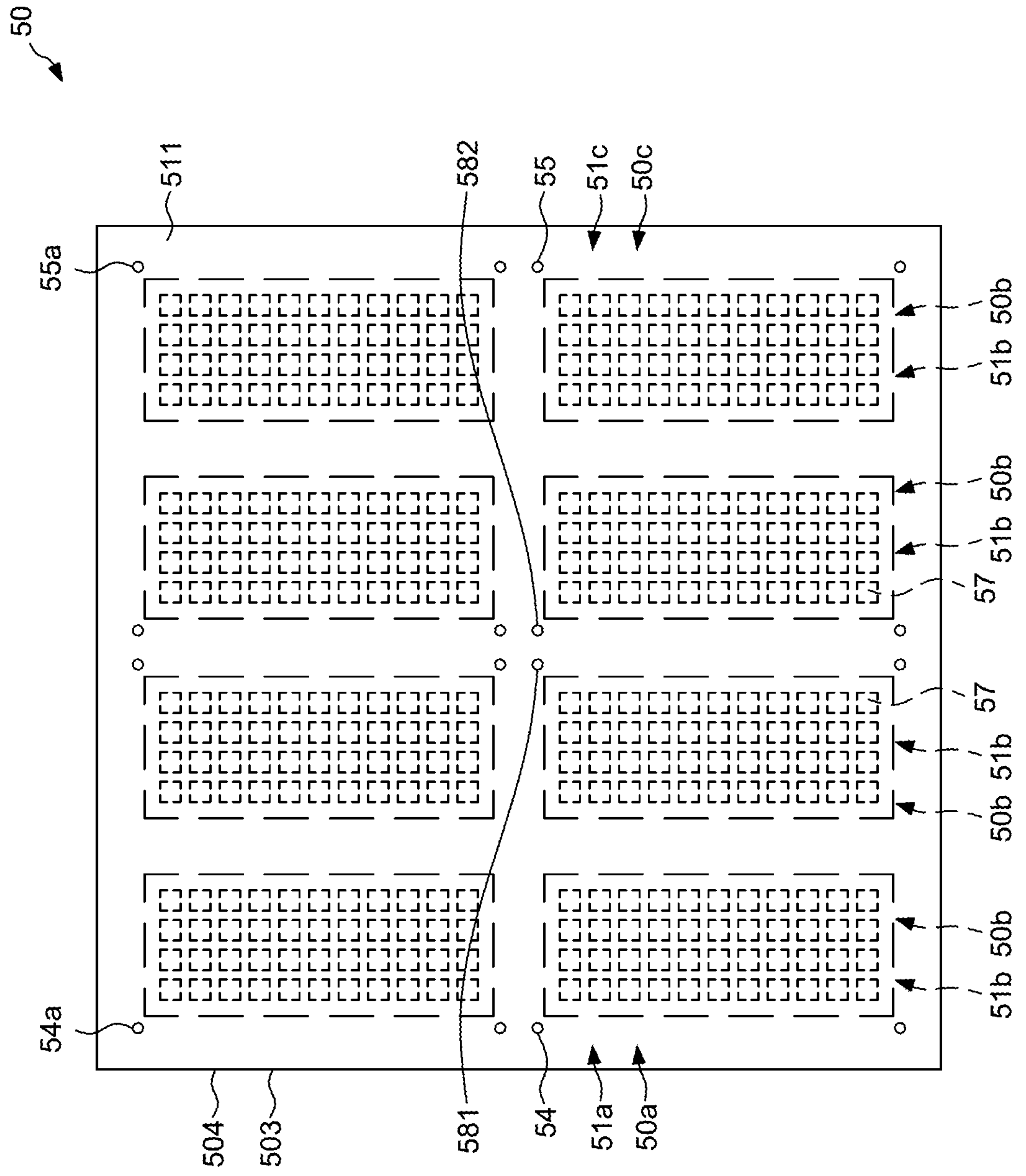
FIG. 31 illustrates a top view of the substrate of FIG. 30.
Figure 32:
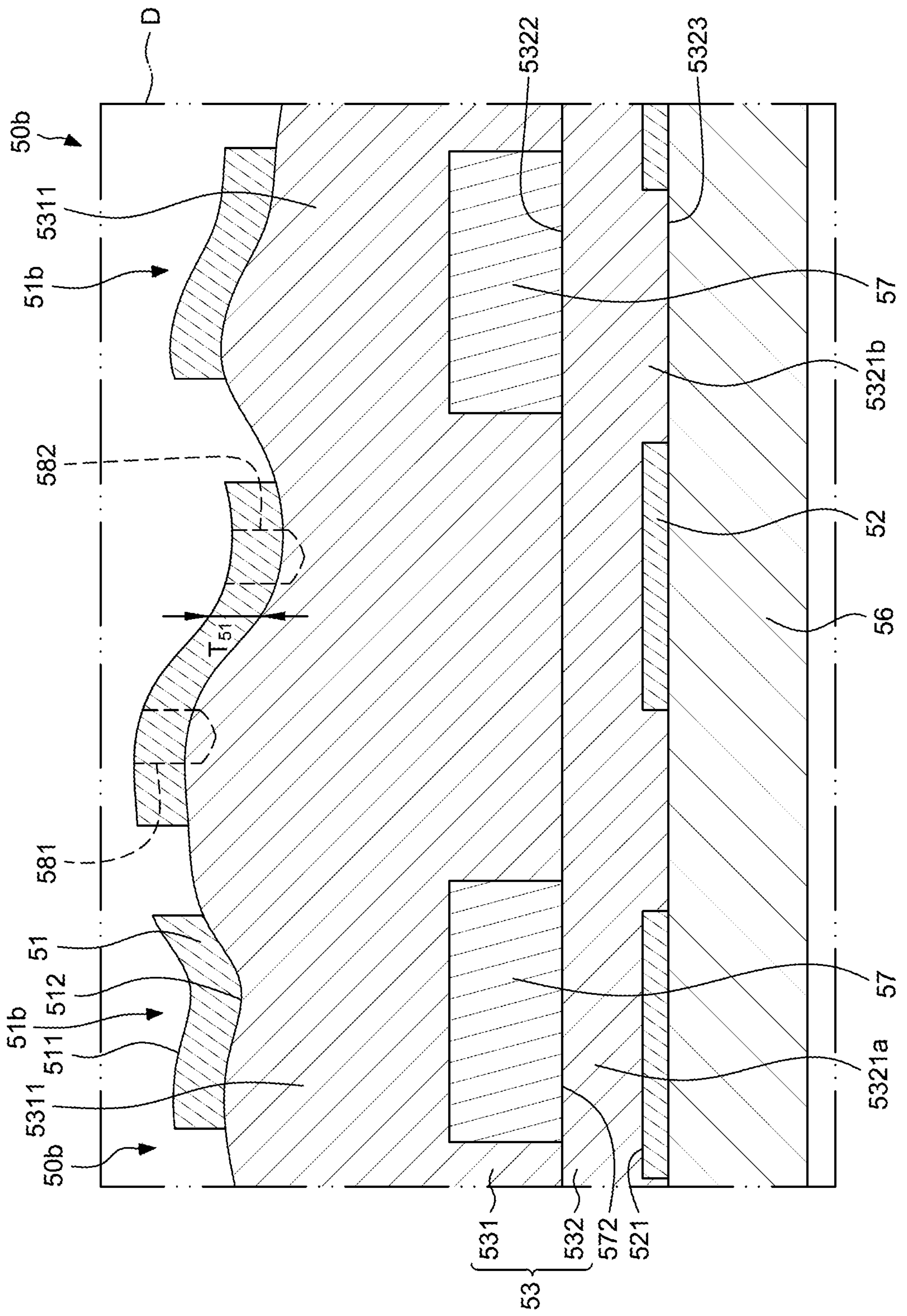
FIG. 32 illustrates an enlarged view of a region "D" in FIG. 30.
Figure 33B:
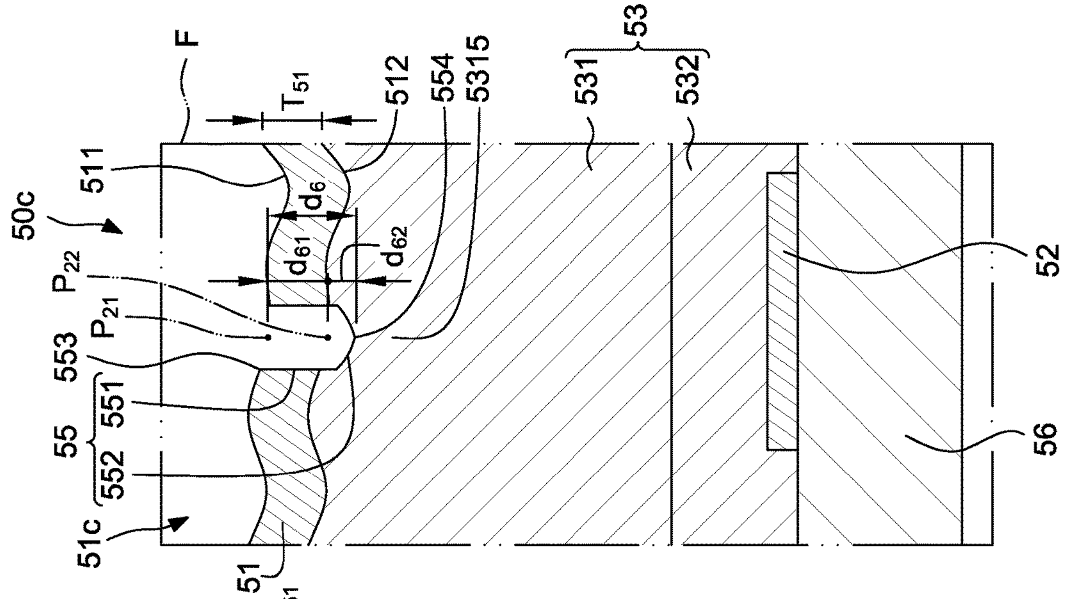
FIG. 33B illustrates an enlarged view of a region "F" in FIG. 30.
Figure 33A:
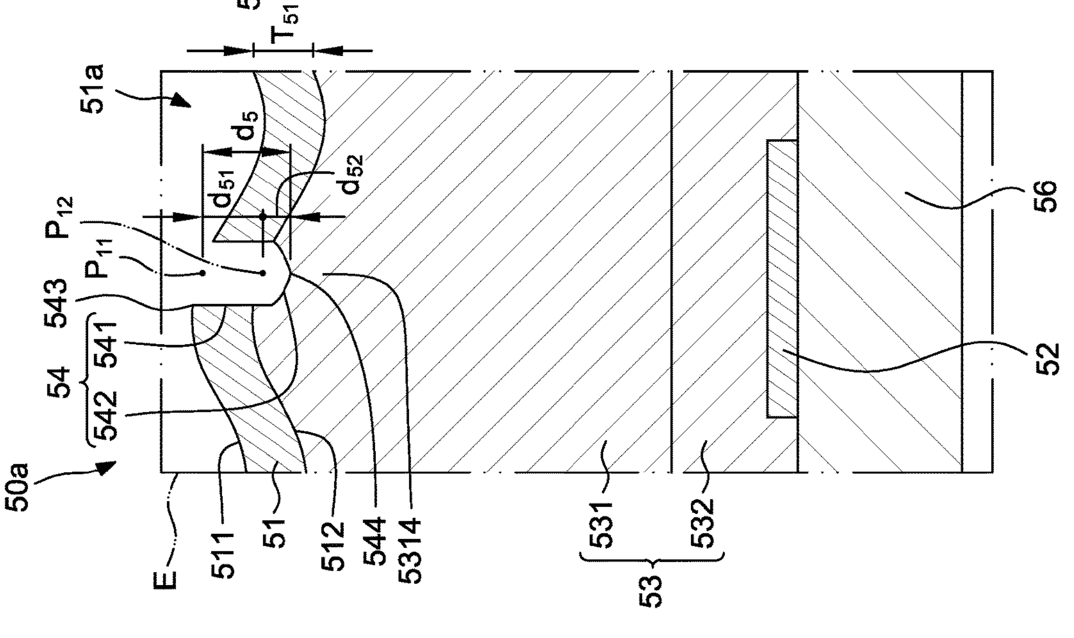
FIG. 33A illustrates an enlarged view of a region "E" in FIG. 30.

FIG. 30 illustrates a schematic view of a substrate 50 according to some embodiments of the present disclosure. FIG. 31 illustrates a top view of the substrate 50 of FIG. 30. FIG. 32 illustrates an enlarged view of a region "D" in FIG. 30. FIG. 33A illustrates an enlarged view of a region "E" in FIG. 30. FIG. 33B illustrates an enlarged view of a region "F" in FIG. 30.

The substrate 50 may be similar to the substrate 10 of FIG. 2 and the workpiece 40 of FIG. 22. The substrate 50 may include a first conductive layer 51, a second conductive layer 52, a base layer 56, a dielectric structure 53 and an electronic device 57. The first conductive layer 51 may be, for example, a metal layer or a circuit layer. The first conductive layer 51 has a first conductive surface 511 (e.g., a top surface) and a second conductive surface 512 (e.g., a bottom surface) opposite to the first conductive surface 511. The first conductive layer 51 may include a first portion 51*a*, a second portion 51*b* and a third portion 51*c* corresponding to a first portion 50*a*, a second portion 50*b* and a third portion 50*c* of the substrate 50, respectively. The second portion 51*b* may be a patterned circuit portion, a circuit region or an active area, and may be located on the second portion 50*b* of the substrate 50. The first portion 51*a* and the third portion 51*c* may be disposed around the second portion 51*b*. The first portion 51*a* and the third portion 51*c* may be dummy portions, non-circuit pattern regions, or non-circuit areas, and may be located on the first portion 50*a* and the third portion 50*c* of the substrate 50 respectively. The first conductive layer 51 may have a uniform thickness or a consistent thickness. The first conductive surface 511 and the second conductive surface 512 of the first conductive layer 51 may be uneven surfaces.

The second conductive layer 52 may be longitudinally spaced apart from the first conductive layer 51. The second conductive layer 52 may be, for example, a metal layer or a circuit layer, and may be disposed on the base layer 56. The dielectric structure 53 may be disposed between the first conductive layer 51 and the base layer 56. In some embodiments, the dielectric structure 53 may include a first layer 531 and a second layer 532. The first layer 531 may be a first dielectric layer, and the second layer 532 may be a second dielectric layer. The second layer 532 may be formed or disposed on the base layer 56 to cover the second conductive layer 52.

The electronic device 57 may be attached to or adhered to the second layer 532. The electronic device 57 may be located under the second portion 51*b* of the first conductive layer 51. There may be no electronic device 57 located under the first portion 51*a* and the third portion 51*c*. The first layer 531 may be formed or disposed on the second layer 532 to cover the electronic device 57. Thus, the electronic device 57 may be encapsulated by the dielectric structure 53.

As shown in FIG. 32, a thickness variation of a first portion 5311 of the first layer 531 of the dielectric structure 53 above the electronic device 57 is different from a thickness variation of a second portion 5321*a*, 5321*b* of the second layer 532 of the dielectric structure 53 under the electronic device 57. In some embodiments, the thickness variation of the first portion 5311 of the first layer 531 may be greater than the thickness variation of the second portion 5321*a*, 5321*b* of the second layer 532. The first conductive layer 51 may be stacked on the first layer 531 of the dielectric structure 53. As shown in FIG. 32, the second portion 5321*a* of the second layer 532 is the portion of the second layer 532 between a bottom surface 572 of the electronic device 57 and a top surface 521 of the second conductive layer 52. The top surface 521 of the second conductive layer 52 may be an interface between the second layer 532 and the second conductive layer 52. The second portion 5321*b* of the second layer 532 is the portion of the second layer 532 between a top surface 5322 of the second layer 532 and a bottom surface 5323 of the second layer 532. Alternatively, the second portion 5321*b* of the second layer 532 is the portion of the second layer 532 between the bottom surface 572 of the electronic device 57 and a top surface of the base layer 56. The top surface of the base layer 56 may be an interface between the second layer 532 and the base layer 56.

In some embodiments, the dielectric structure 53 may include at least one resin film. A material of the resin film may include epoxy and inorganic oxide powder or filler. The resin film may be free of fibers, and may include a jelly-like substance before being cured. Thus, the first layer 531 may be a resin film, and the second layer 532 may be also a resin film. A material of the first layer 531 may be same as or different from a material of the second layer 532.

As shown in FIG. 30, the substrate 50 may define a first hole 54 and a second hole 55 located on the first portion 51*a* or the third portion 51*c* of the first conductive layer 51. The first hole 54 may extend from the first conductive surface 511 (e.g., the top surface) of the first conductive layer 51 toward the dielectric structure 53. The first hole 54 may be recessed form the first conductive surface 511 (e.g., the top surface) of the first conductive layer 51, and may expose a first portion 5314 of the first layer 531 of the dielectric structure 53 so as to be detected or recognized by human eyes or a detector such as a charge coupled device (CCD). In addition, the second hole 55 may be spaced apart from the first hole 54, and may extend from the first conductive surface 511 (e.g., the top surface) of the first conductive layer 51 toward the dielectric structure 53. The second hole 55 may be recessed form the first conductive surface 511 (e.g., the top surface) of the first conductive layer 51, and may expose a second portion 5315 of the first layer 531 of the dielectric structure 53 so as to be detected or recognized by human eyes or a detector such as a charge coupled device (CCD).

As shown in FIG. 30 to FIG. 32, the substrate 50 may further define a third hole 581, a fourth hole 582, a fifth hole 54*a* and a sixth hole 55*a*. The shape and function of the third hole 581, the fourth hole 582, the fifth hole 54*a* and the sixth hole 55*a* may be same as or similar to the first hole 54 or the second hole 55. Thus, the third hole 581, the fourth hole 582, the fifth hole 54*a* and the sixth hole 55*a* may be recessed form the first conductive surface 511 (e.g., the top surface) of the first conductive layer 51, and may expose a portion of the first layer 531 of the dielectric structure 53 so as to be detected or recognized by human eyes or a detector such as a charge coupled device (CCD). The third hole 581 and the fourth hole 582 may be located at the position between the second portions 51*b*. The fifth hole 54*a* and the sixth hole 55*a* may be located at the corners of the substrate 50.

As shown in FIG. 33A and FIG. 33B, a first depth $d_5$ of the first hole 54 may be substantially equal to a second depth do of the second hole 55. An elevation of a topmost end 543 of the first hole 54 may be different from an elevation of a topmost end 553 of the second hole 55. For example, the elevation of the topmost end 543 of the first hole 54 may be higher than the elevation of the topmost end 553 of the second hole 55. In some embodiments, the first hole 54 may include a first portion 541 and second portion 542. The first portion 541 may be a through hole that extends through the first conductive layer 51, and may be in a cylinder shape. The first portion 541 may have a depth $d_{51}$. The second portion 542 may be a blind hole that is embedded in the first layer 531 of the dielectric structure 53, and may be communicated with the first portion 541. The second portion 542 may taper from the first conductive layer 51 toward the dielectric structure 53. The second portion 542 may have a depth $d_{52}$. In addition, the second hole 55 may include a first portion 551 and second portion 552. The first portion 551 may be a through hole that extends through the first conductive layer 51, and may be in a cylinder shape. The first portion 551 may have a depth $d_{61}$. The second portion 552 may be a blind hole that is embedded in the first layer 531 of the dielectric structure 53, and may be communicated with the first portion 551. The second portion 552 may taper from the first conductive layer 51 toward the dielectric structure 53. The second portion 552 may have a depth $d_{62}$. The depth $d_{51}$ of the first portion 541 of the first hole 54 may be substantially equal to a depth $d_{61}$ of the first portion 551 of the second hole 55. The depth $d_{52}$ of the second portion 542 of the second hole 55 may be substantially equal to a depth $d_{62}$ of the second portion 552 of the second hole 55. An elevation of a bottommost end 544 of the second portion 542 of the first hole 54 may be different from an elevation of a bottommost end 554 of the second portion 552 of the second hole 55.

The first hole 54 and the second hole 55 may be used as alignment marks that can be detected or recognized by human eyes or a detector such as a charge coupled device (CCD) above the substrate 50 during a manufacturing process. In some embodiments, the alignment mark(s) of a mask used in a patterning process may be aligned with the first hole 54 and/or the second hole 55 of the substrate 50.

As shown in FIG. 30 and FIG. 31, the substrate 50 may have a lateral surface 503 and an edge 504. The lateral surface 503 may extend between the top surface of the substrate 50 and the bottom surface of the substrate 50. The edge 504 may correspond to the lateral surface 503. The first portion 51*a* and the third portion 51*c* of the first conductive layer 51 are located adjacent to the lateral surface 503 or the edge 504. Thus, the first portion 51*a* and the third portion 51*c* of the first conductive layer 51 is closer to the lateral surface 503 or the edge 504 than the second portion 51*b* of the first conductive layer 51 is. In addition, the first portion 51*a* and the third portion 51*c* of the first conductive layer 51 is closer to the lateral surface 503 or the edge 504 than the electronic device 57 is. Thus, the first hole 54, the second hole 55, the fifth hole 54*a* and the sixth hole 55*a* are closer to the lateral surface 503 or the edge 504 than the electronic device 57 is.

FIG. 34 through FIG. 39 illustrate a method for manufacturing a substrate according to some embodiments of the present disclosure. In some embodiments, the method is for manufacturing the substrate 50 shown in FIG. 30.

Figure 34:
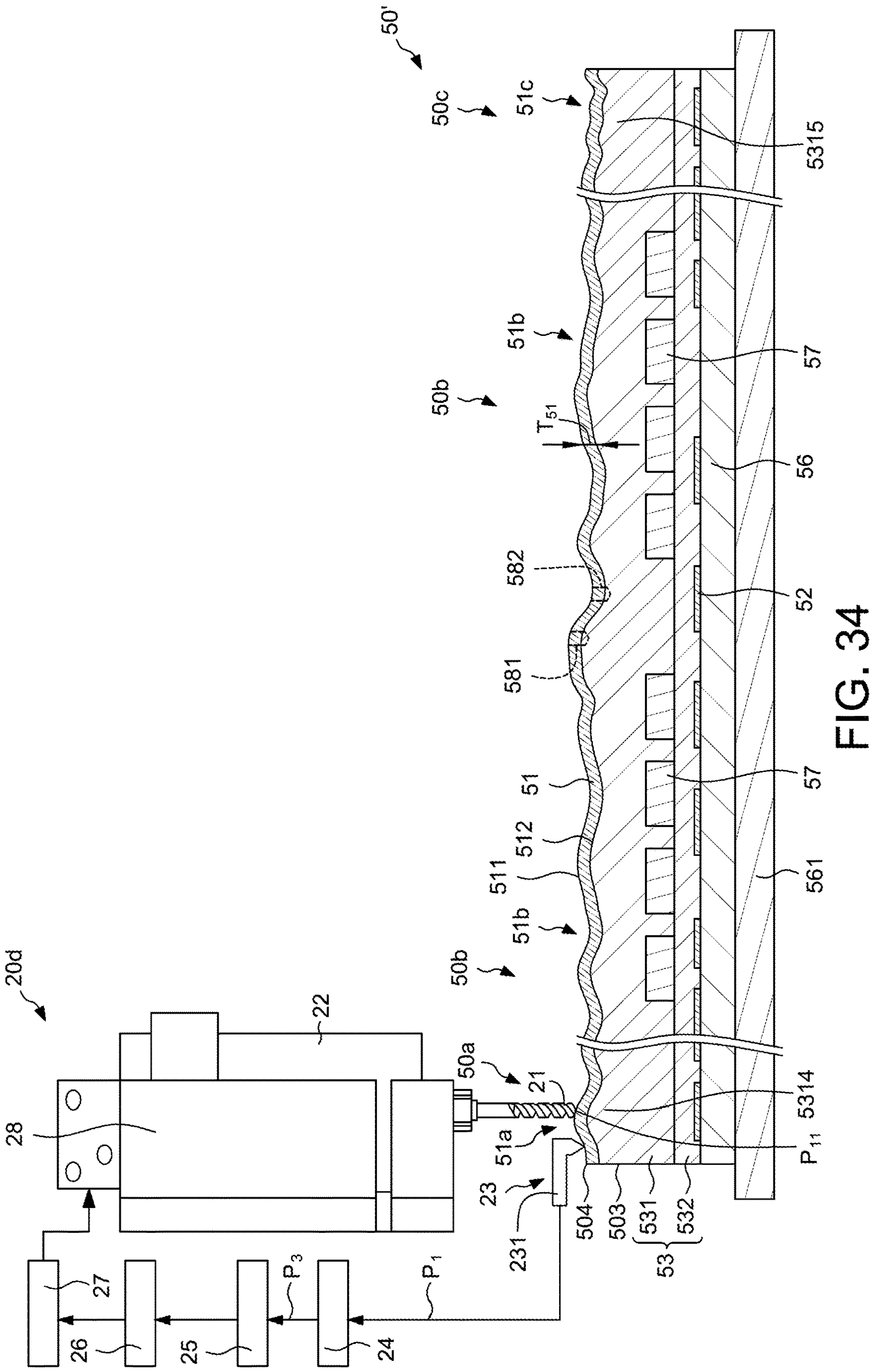
FIG. 34 illustrates a schematic view of one or more stages of an example of a method for manufacturing a substrate according to some embodiments of the present disclosure.

Referring to FIG. 34, a structure 50' (or an assembly structure 50') may be provided. The assembly structure 50' may include a first conductive layer 51, a second conductive layer 52, a base layer 56, a dielectric structure 53, an electronic device 57 and a carrier 561. The first conductive layer 51, the second conductive layer 52, the base layer 56, the dielectric structure 53 and the electronic device 57 may be stacked on the carrier 561. Thus, the base layer 56 and the dielectric structure 53 may be disposed between the first conductive layer 51 and the carrier 561. For example, the carrier 561 may be a metal plate such as a steel plate or an aluminum plate. The first conductive layer 51 may be, for example, a metal layer. In some embodiments, the first conductive layer 51 may include conductive polymer such as polyacetylene. The first conductive layer 51 has a first conductive surface 511 (e.g., a top surface) and a second conductive surface 512 (e.g., a bottom surface) opposite to the first conductive surface 511. The first conductive layer 51 may include a first portion 51*a*, a second portion 51*b* and a third portion 51*c*. The first portion 51*a* and the third portion 51*c* may be disposed around the second portion 51*b*. The first conductive layer 51 may have a uniform thickness or a consistent thickness. The first conductive surface 511 and the second conductive surface 512 of the first conductive layer 51 may be uneven surfaces.

The second conductive layer 52 may be longitudinally spaced apart from the first conductive layer 51. The second conductive layer 52 may be disposed on the base layer 56. The dielectric structure 53 may be disposed between the first conductive layer 51 and the base layer 56. In some embodiments, the dielectric structure 53 may include a first layer 531 and a second layer 532. The first layer 531 may be a first dielectric layer, and the second layer 532 may be a second dielectric layer. The second layer 532 may be formed or disposed on the base layer 56 to cover the second conductive layer 52. The second conductive surface 512 (e.g., a bottom surface) of the first conductive layer 51 may face and contact the first layer 531 of the dielectric structure 53.

The electronic device 57 may be attached to or disposed on the second layer 532. The electronic device 57 may be located under the second portion 51*b* of the first conductive layer 51. The first layer 531 may be formed or disposed on the second layer 532 to cover the electronic device 57. Thus, the electronic device 57 may be encapsulated by the dielectric structure 53.

A drilling device 20*d* may be provided. The drilling device 20*d* of FIG. 34 may be same as or similar to the drilling device 20 of FIG. 1 to FIG. 4. The drilling tool 21 of the drilling device 20*d* is moved to contact the first conductive surface 511 (e.g., the top surface) of the first conductive layer 51 of the assembly structure 50' so as to detect the first conductive surface 511 (e.g., the top surface) of the first conductive layer 51 of the assembly structure 50'. A first start point Pu is defined through a first electric signal generated by the drilling tool 21 contacting the first conductive surface 511 of the first conductive layer 51. The first start point Pu of the first conductive surface 511 (e.g., the top surface) may be selected or predetermined when the drilling tool 21 contacts the first conductive surface 511 (e.g., the top surface). The first start point $P_{11}$ is located outside the second portion 51*b* (e.g., the patterned circuit portion) of the first conductive layer 51 of FIG. 30. Meanwhile, a first electrical loop is formed through electrical connections of the drilling tool 21, the first conductive surface 511 of the first conductive layer 51, the first conductive element 231 and the current source 22. In some embodiments, the first electrical loop may generate the first electric signal. In some embodiments, the top surface 511 of the first conductive layer 51 is determined or detected when the drilling tool 21 contacts the first conductive layer 51 at the first start point $P_{11}$. In some embodiments, when the first electrical loop and the first electric signal are generated, the drilling tool 21 starts to rotate so as to start the drilling process or drilling operation.

Figure 35:
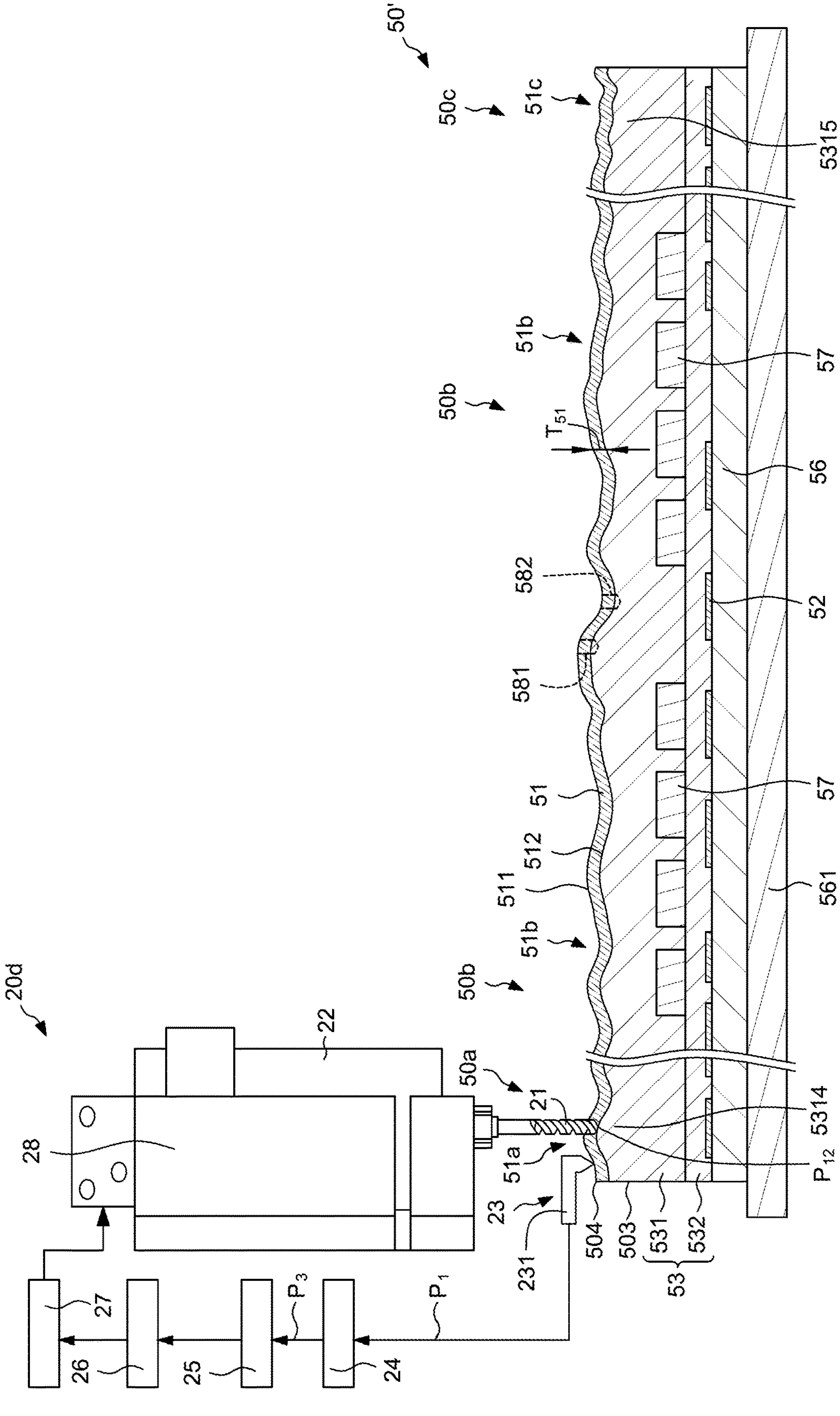
FIG. 35 illustrates a schematic view of one or more stages of an example of a method for manufacturing a substrate according to some embodiments of the present disclosure.

Referring to FIG. 35, the drilling tool 21 is moved downward to drill the detected top surface 511 of the first conductive layer 51 at the first start point $P_{11}$ by a first predetermined distance until the drilling tool 21 reaches a first lower point $P_{12}$ on the bottom surface 512 of the first conductive layer 51. Thus, the first predetermined distance may be a distance between the first start point Pu and the first lower point $P_{12}$, and may be equal to the depth $d_{51}$ of the first portion 541 of the first hole 54 of FIG. 33A or equal to a thickness $T_{51}$ of the first conductive layer 51. That is, the assembly structure 50' is drilled since the top surface 511 toward the first layer 531 of the dielectric structure 53 by the first predetermined distance no less than the thickness $T_{51}$ of the first conductive layer 51 to form an alignment mark (e.g., the first hole 54 of FIG. 30). Meanwhile, the drilling tool 21 penetrates through the first conductive layer 51, and a first drilling depth in the first conductive layer 51 may be equal to the first predetermined distance (e.g., the depth $d_{51}$ of the first portion 541 of the first hole 54).

Figure 36:
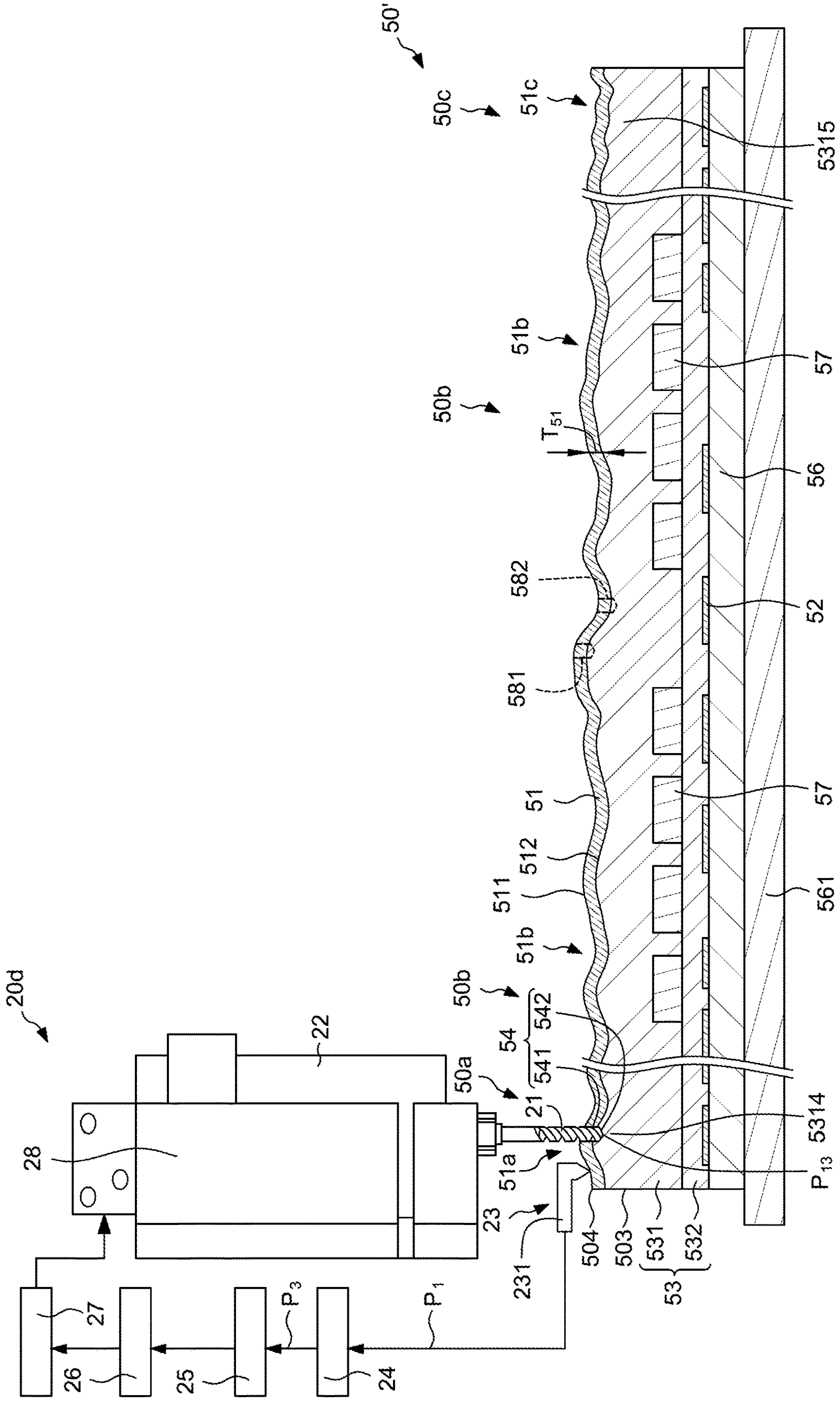
FIG. 36 illustrates a schematic view of one or more stages of an example of a method for manufacturing a substrate according to some embodiments of the present disclosure.

Referring to FIG. 36, the drilling tool 21 is further moved downward to drill the first layer 531 (e.g., the first dielectric layer) of the dielectric structure 53 after the drilling tool 21 passes through the first conductive layer 51. The drilling tool 21 may further moved downward by a second predetermined distance until the drilling tool 21 reaches a first end point $P_{13}$ in the first layer 531 (e.g., the first dielectric layer) of the dielectric structure 53. Thus, the second predetermined distance may be a distance between the first lower point $P_{12}$ and the first end point $P_{13}$, and may be equal to the depth $d_{52}$ of the second portion 542 of the first hole 54 of FIG. 33A. Meanwhile, the drilling tool 21 does not penetrates through the first layer 531 (e.g., the first dielectric layer) of the dielectric structure 53. The first hole 54 of FIG. 33A may be formed. The first end point $P_{13}$ is the bottommost end 544 of the second portion 542 of the first hole 54 of FIG. 33A. A second drilling depth (or a depth) in the first layer 531 (e.g., the first dielectric layer) of the dielectric structure 53 may be equal to the second predetermined distance (e.g., the depth $d_{52}$ of the second portion 542 of the first hole 54). That is, the drilling tool 21 may drill the first layer 531 (e.g., the first dielectric layer) of the dielectric structure 53 with the second drilling depth therein. The second drilling depth (e.g., the depth $d_{52}$ of the second portion 542 of the first hole 54) in the first layer 531 may be less than the first drilling depth in the first conductive layer 51 (e.g., the depth $d_{51}$ of the first portion 541 of the first hole 54). Alternatively, the second drilling depth in the first layer 531 may be less than the thickness $T_{51}$ of the first conductive layer 51.

Figure 37:
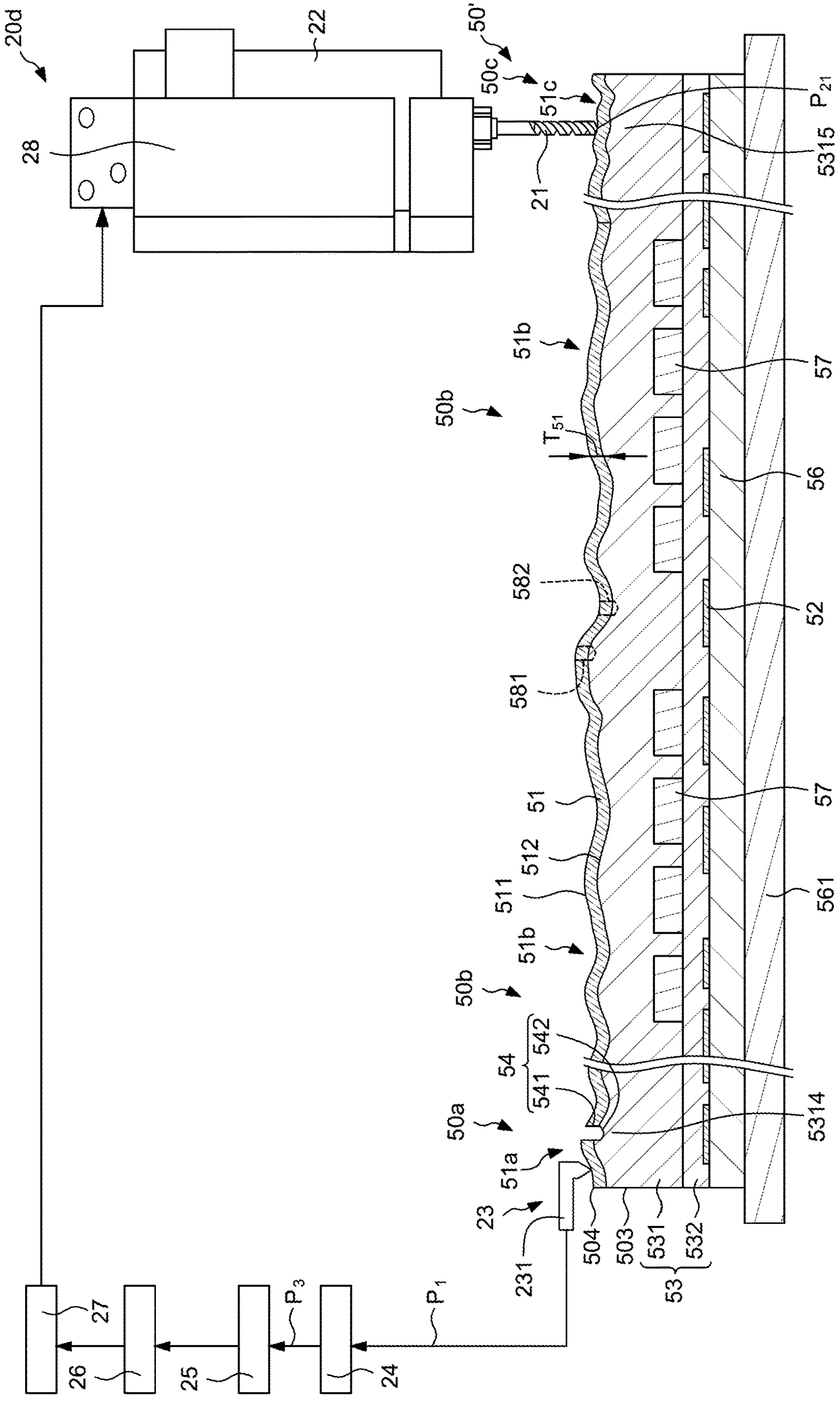
FIG. 37 illustrates a schematic view of one or more stages of an example of a method for manufacturing a substrate according to some embodiments of the present disclosure.

Referring to FIG. 37, the drilling device 20*d* and the drilling tool 21 are moved away from the first hole 54. Then, the drilling tool 21 of the drilling device 20*d* is moved to contact the first conductive surface 511 (e.g., the top surface) of the first conductive layer 51 of the assembly structure 50' so as to detect the first conductive surface 511 (e.g., the top surface) of the first conductive layer 51 of the assembly structure 50'. A second start point $P_{21}$ is defined through a second electric signal generated by the drilling tool 21 contacting the first conductive surface 511 of the first conductive layer 51. The second start point $P_{21}$ of the first conductive surface 511 (e.g., the top surface) may be selected or predetermined when the drilling tool 21 contacts the first conductive surface 511 (e.g., the top surface). The second start point $P_{21}$ is located outside the second portion 51*b* (e.g., the patterned circuit portion) of the first conductive layer 51 of FIG. 30. An elevation of the first start point Pu is different from an elevation of the second start point $P_{21}$. That is, the second start point $P_{21}$ is not level with the first start point $P_{11}$. Meanwhile, a second electrical loop is formed through electrical connections of the drilling tool 21, the first conductive surface 511 of the first conductive layer 51, the first conductive element 231 and the current source 22. In some embodiments, the second electrical loop may generate the second electric signal. In some embodiments, the top surface 511 of the first conductive layer 51 is determined or detected when the drilling tool 21 contacts the first conductive layer 51 at the second start point $P_{21}$. In some embodiments, when the second electrical loop and the second electric signal are generated, the drilling tool 21 starts to rotate so as to start the drilling process or drilling operation.

Figure 38:
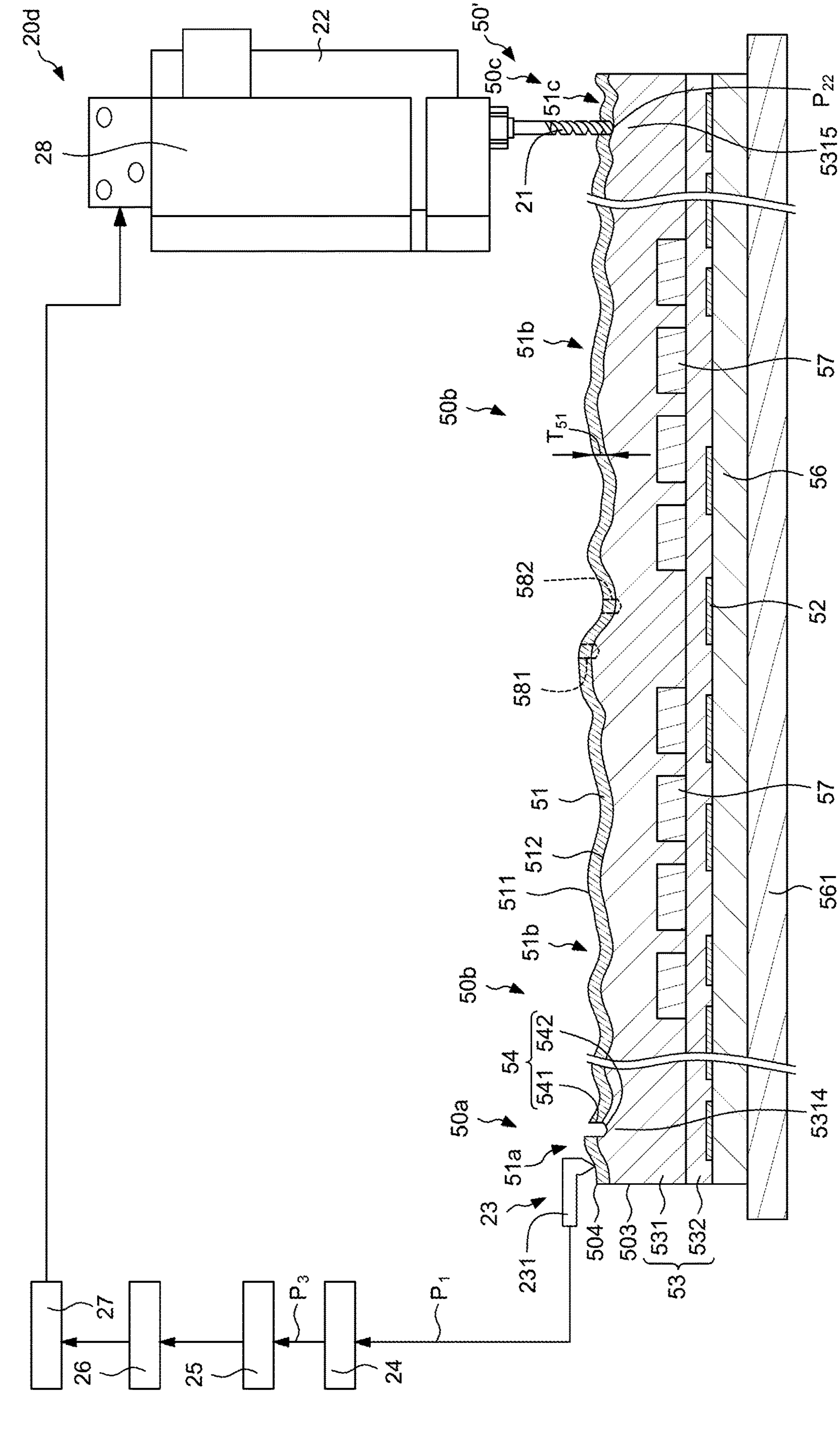
FIG. 38 illustrates a schematic view of one or more stages of an example of a method for manufacturing a substrate according to some embodiments of the present disclosure.

Referring to FIG. 38, the drilling tool 21 is moved downward to drill the detected top surface 511 of first conductive layer 51 at the second start point $P_{21}$ by a third predetermined distance until the drilling tool 21 reaches a second lower point $P_{22}$ on the bottom surface 512 of the first conductive layer 51. Thus, the third predetermined distance may be a distance between the second start point $P_{21}$ and the second lower point $P_{22}$, and may be equal to the depth $d_{61}$ of the first portion 551 of the second hole 55 of FIG. 33B or equal to a thickness $T_{51}$ of the first conductive layer 51. That is, the assembly structure 50' is drilled since the top surface 511 toward the first layer 531 of the dielectric structure 53 by the third predetermined distance no less than the thickness $T_{51}$ of the first conductive layer 51 to form an alignment mark (e.g., the second hole 55 of FIG. 30). Meanwhile, the drilling tool 21 penetrates through the first conductive layer 51, and a third drilling depth in the first conductive layer 51 may be equal to the third predetermined distance (e.g., the depth $d_{61}$ of the first portion 551 of the second hole 55). In addition, the third predetermined distance (e.g., the depth $d_{61}$ of the first portion 551 of the second hole 55) may be substantially equal to the first predetermined distance (e.g., the depth $d_{51}$ of the first portion 541 of the first hole 54).

Figure 39:
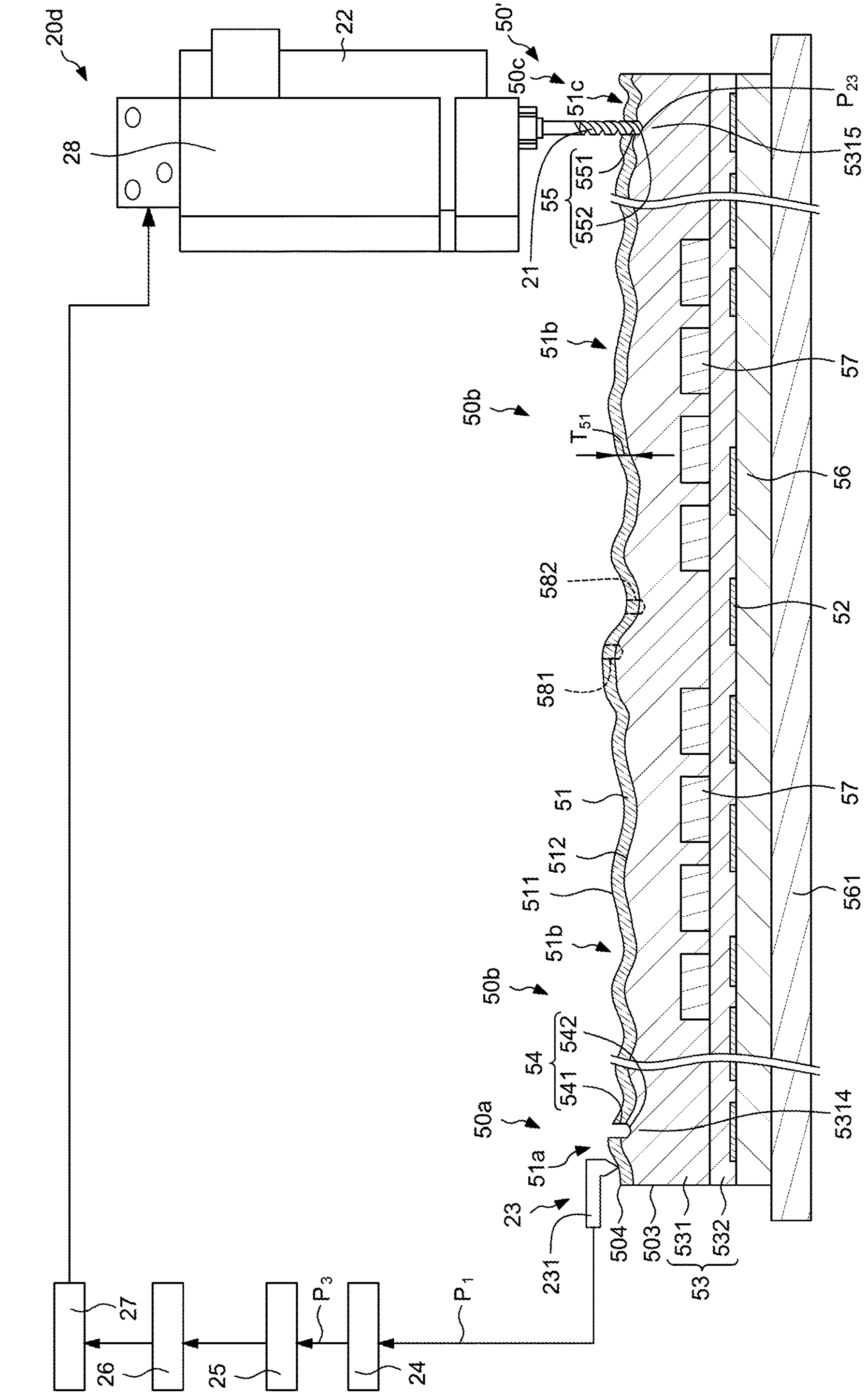
FIG. 39 illustrates a schematic view of one or more stages of an example of a method for manufacturing a substrate according to some embodiments of the present disclosure.

Referring to FIG. 39, the drilling tool 21 is further moved downward to drill the first layer 531 (e.g., the first dielectric layer) of the dielectric structure 53 after the drilling tool 21 passes through the first conductive layer 51. The drilling tool 21 may further moved downward by a fourth predetermined distance until the drilling tool 21 reaches a second end point $P_{23}$ in the first layer 531 (e.g., the first dielectric layer) of the dielectric structure 53. Thus, the fourth predetermined distance may be a distance between the second lower point $P_{22}$ and the second end point $P_{23}$, and may be equal to the depth $d_{62}$ of the second portion 552 of the second hole 55 of FIG. 33B. Meanwhile, the drilling tool 21 does not penetrates through the first layer 531 (e.g., the first dielectric layer) of the dielectric structure 53. The second hole 55 of FIG. 33A may be formed. The second end point $P_{23}$ is the bottommost end 554 of the second portion 552 of the second hole 55 of FIG. 33B. A fourth drilling depth in the first layer 531 (e.g., the first dielectric layer) of the dielectric structure 53 may be equal to the fourth predetermined distance (e.g., the depth $d_{62}$ of the second portion 552 of the second hole 55).

Then, the second portion 51*b* of the first conductive layer 51 may be patterned to form a circuit layer according to the alignment marks (e.g., the first hole 54 and the second hole 55). Thus, the second portion 51*b* of the first conductive layer 51 may be a circuit region. That is, at least a portion of the first conductive layer 51 disposed in the second portion 50*b* of the substrate 50 may be patterned to form a circuit region. In some embodiments, the alignment mark(s) of a mask used in the patterning process may be aligned with the alignment marks (e.g., the first hole 54 and the second hole 55) the assembly structure 50'.

Then, the carrier 561 may be removed from the assembly structure 50' so as to form the substrate 50 of FIG. 30.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a substrate, comprising:

providing a carrier with a dielectric layer and a conductive layer stacked thereon, wherein the conductive layer has a bottom surface facing the dielectric layer and a top surface;

electrically connecting the top surface of the conductive layer to a current source, wherein the current source is electrically connected to a drilling tool;

determining a start point when the drilling tool contacts the top surface of the conductive layer, wherein the step of determining the start point includes:

determining a first start point of the top surface of the conductive layer when the drilling tool contacts the top surface; and determining a second start point of the top surface of the conductive layer when the drilling tool contacts the conductive layer again; wherein the second start point is not level with the first start point; and drilling the conductive layer since the start point and drilling toward the dielectric layer by a predetermined distance no less than a thickness of the conductive layer, wherein the step of drilling the conductive layer includes:

drilling since the first start point toward the dielectric layer by a first predetermined distance so as to form a first hole, wherein the first hole includes a first dimple recessed from a top surface of a second conductive layer under the dielectric layer; and drilling since the second start point toward the dielectric layer by a second predetermined distance different from the first predetermined distance so as to form a second hole, wherein the second hole includes a second dimple recessed from the top surface of the second conductive layer under the dielectric layer, wherein an elevation of the first dimple is substantially the same as an elevation of the second dimple.

* * * * *